US012683118B2

(12) United States Patent
Moser et al.

(10) Patent No.: US 12,683,118 B2
(45) Date of Patent: Jul. 14, 2026

(54) SCANNING ELECTRON MICROSCOPY-BASED SAMPLE ANALYSIS

(71) Applicant: Infineon Technologies AG, Neubiberg (DE)

(72) Inventors: Maximilian Alexander Moser, Vienna (AT); Gregor Bernhard Pobegen, Villach (AT); Michael Nelhiebel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 338 days.

(21) Appl. No.: 18/220,931

(22) Filed: Jul. 12, 2023

(65) Prior Publication Data

US 2025/0022681 A1      Jan. 16, 2025

(51) Int. Cl.
$H01J\ 37/28$ (2006.01)
$H01J\ 37/26$ (2006.01)

(52) U.S. Cl.
CPC ............ *H01J 37/28* (2013.01); *H01J 37/265* (2013.01); *H01J 2237/2801* (2013.01); *H01J 2237/2802* (2013.01)

(58) Field of Classification Search
CPC .. H01J 37/00; H01J 37/02; H01J 37/26; H01J 37/265; H01J 37/28; H01J 2237/2801; H01J 2237/2802; G01N 23/2251
USPC ......................................... 250/306, 307, 311
See application file for complete search history.

(56) References Cited

U.S. PATENT DOCUMENTS

| | | | | |
|---|---|---|---|---|
| 2010/0320381 | A1* | 12/2010 | Zhao | H01J 37/28 250/306 |
| 2011/0163229 | A1* | 7/2011 | Frosien | H01J 37/28 250/396 ML |
| 2012/0292505 | A1* | 11/2012 | Damiano | H01J 37/26 374/E7.004 |

OTHER PUBLICATIONS

Cordelia P. Sealy, et al.; Mechanism for secondary electron dopant contrast in the SEM; Journal of Electron Microscopy 49(2) 311-321 (2000); Sep. 22, 1999; 11 Pgs.
Marco Buzzo, et al.; Secondary Electron Potential Contrast for Dopant Profiling of Silicon Carbide Devices; 10 Pgs.
Augustus K. W. Chee, et al.; A quantitative model for doping contrast in the scanning electron microscope using calculated potential distributions and Monte Carlo simulations; Journal of Applied Physics; https://doi.org/10.1063/1.3524186; Jan. 11, 2011; 10 Pgs.
Moser Maximilian, et al.; Quantification of secondary electron doping contrast in the scanning electron microscope on 4H—SiC; 2Institute for Solid State Electronics; 7 Pgs.

(Continued)

*Primary Examiner* — Jason L McCormack
(74) *Attorney, Agent, or Firm* — Cooper Legal Group LLC

(57) ABSTRACT

A method of determining sample information associated with a sample is provided. In an embodiment, when a sample has a first temperature, a first measure of electrons of the sample is determined. When the sample has a second temperature different than the first temperature, a second measure of electrons of the sample is determined. Sample information associated with the sample is determined based upon the first measure of electrons and the second measure of electrons. The sample information includes a dopant concentration of the sample, a measure of electric field strength of the sample, a defect concentration of the sample, a Fermi level of the sample and/or an indication of a space charge region of the sample.

10 Claims, 14 Drawing Sheets

(56)                    References Cited

OTHER PUBLICATIONS

Search Report From Corresponding International Application No.
PCT/EP2024/066086, dated Aug. 6, 2024.
Shanshan Dong, et al., "Synthesis of Er3+:Al2O3-doped and rutile-
dominant TiO2 composite with increased responsive wavelength
range and enhanced photocatalytic performance under visible light
irradiation", Journal of Molecular Catalysis A Chemical, vol. 407,
2015, pp. 38-46, Jun. 16, 2015, XP029311443.
Daisuke Tsurumi, et al., "Dopant Mapping of Semiconductors with
Scanning Electron Microscopy", Oct. 1, 2013, pp. 1-6, XP093189173,
URL: https://sumitomoelectric.com/sites/default/files/2020-12/
download_documents/77-26.pdf.
F. Triendl, et al., "Growth and characterization of low pressure
chemical vapor deposited Si on Si-face 4H—SiC", ScienceDirect,
Materials Science in Semiconductor Processing, vol. 131, Aug. 1,
2021 p. 105888, XP093189905, URL: https://www.sciencedirect.
com/science/article/pii/s1369800121002249.

* cited by examiner 1001
102
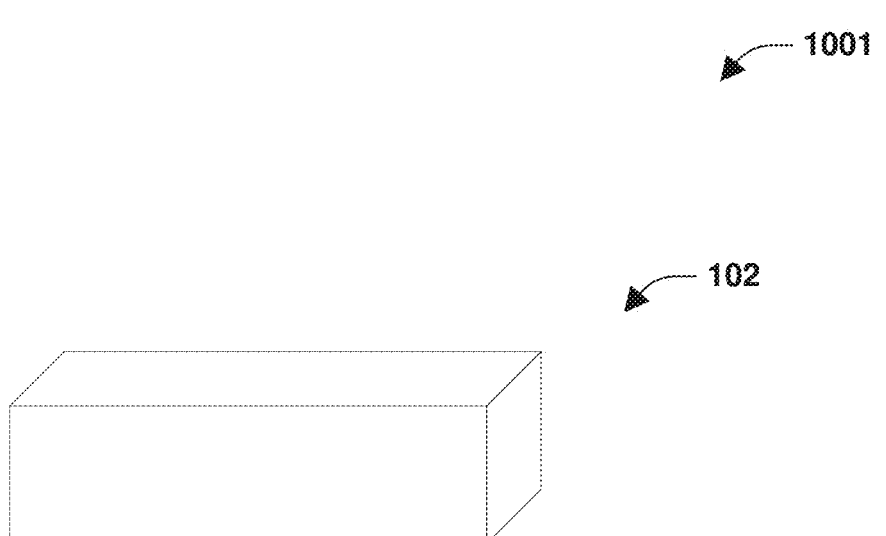
1002
104
108
106
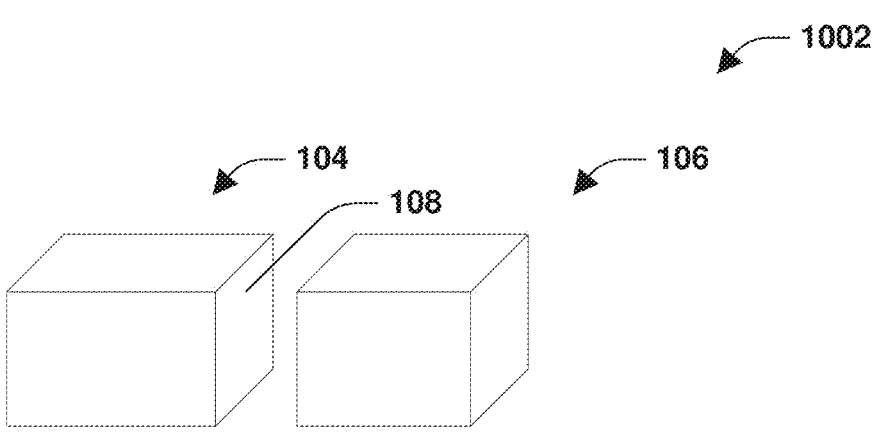
FIG. 1A

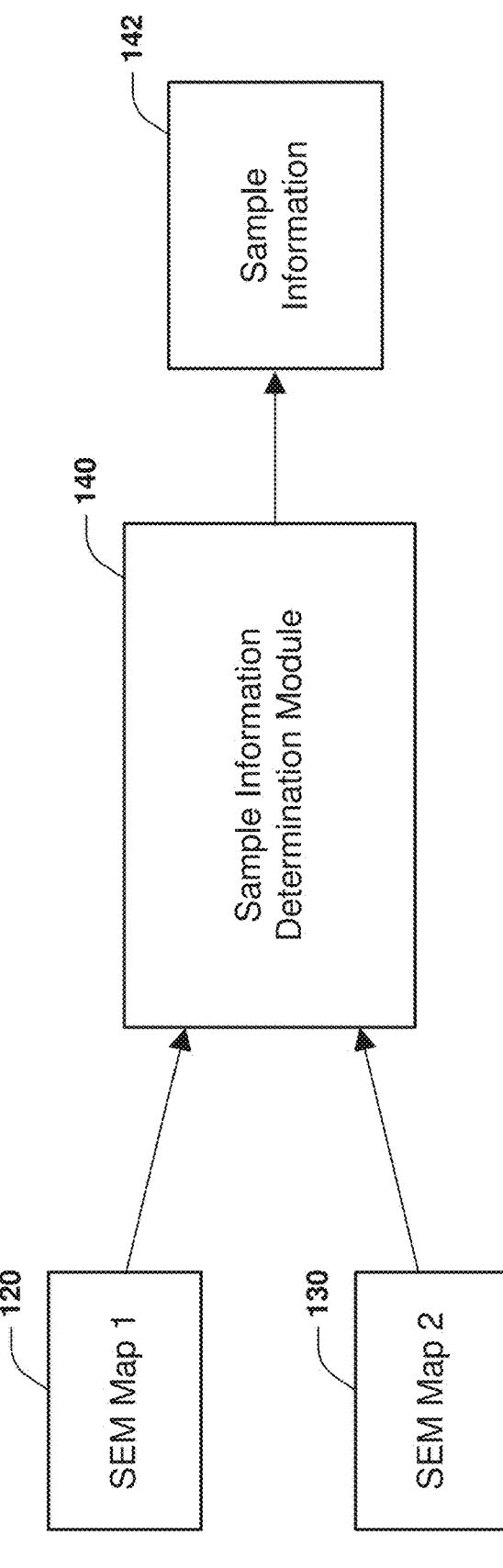
FIG. 1D

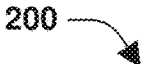
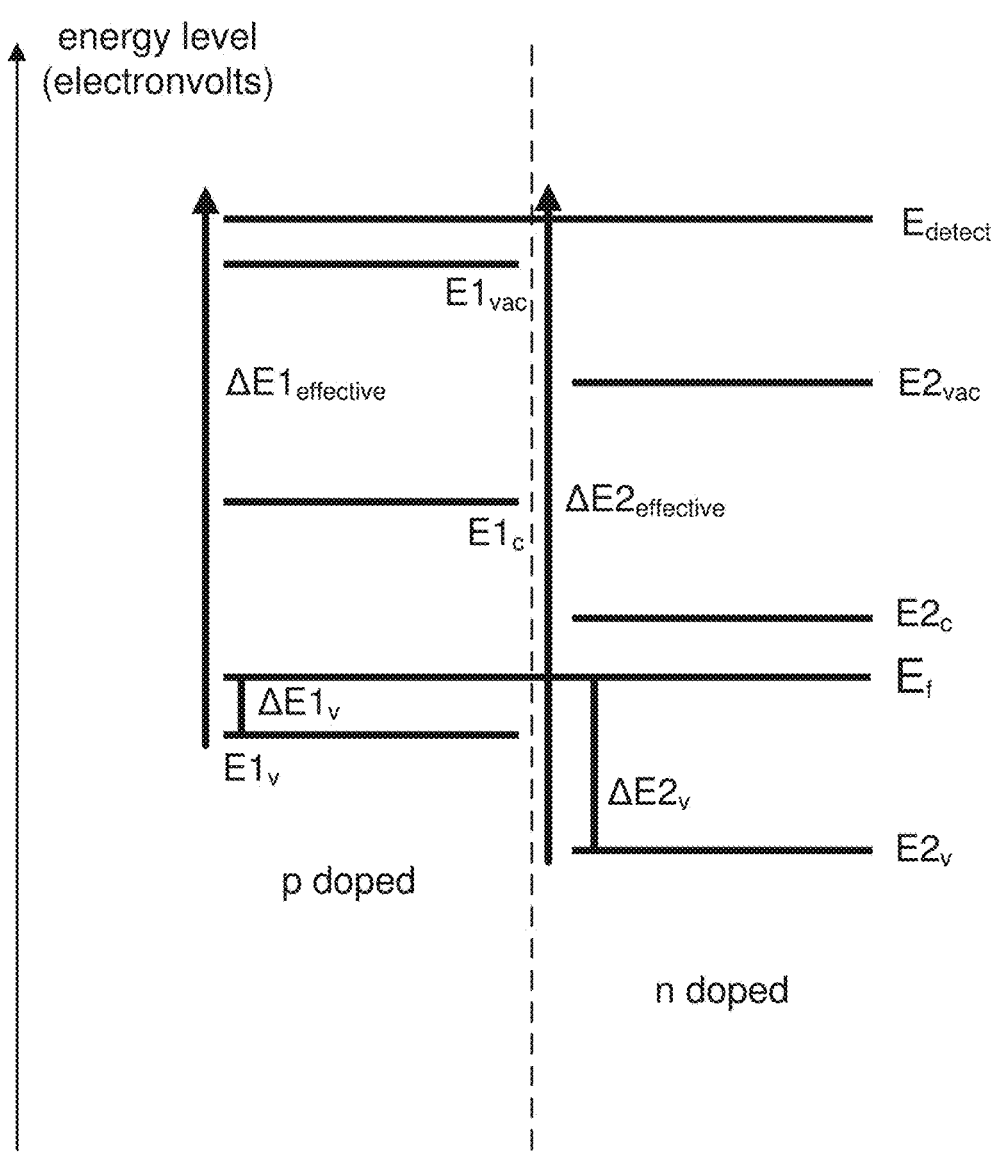
FIG. 2A

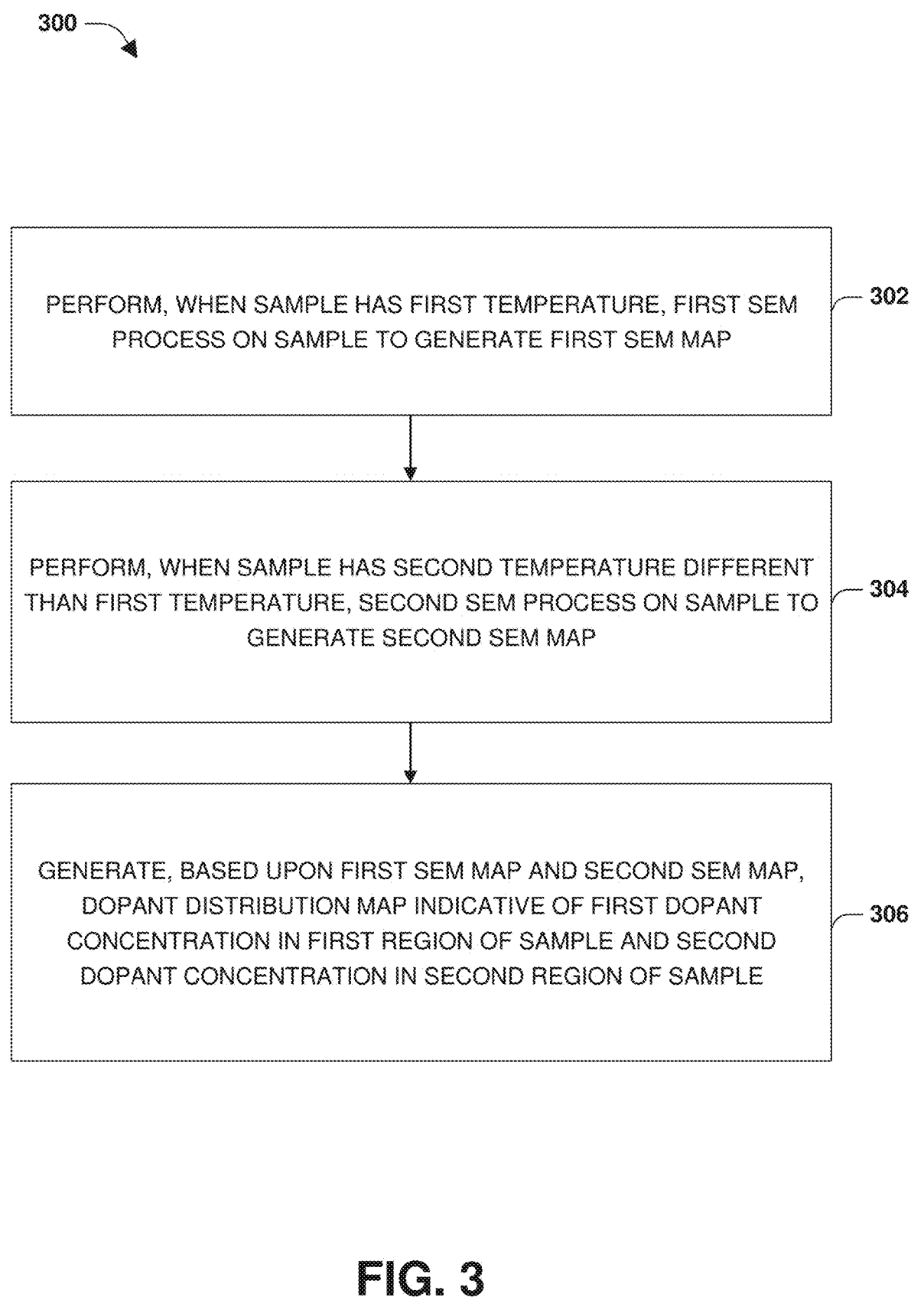

300

PERFORM, WHEN SAMPLE HAS FIRST TEMPERATURE, FIRST SEM PROCESS ON SAMPLE TO GENERATE FIRST SEM MAP ⟋ 302

PERFORM, WHEN SAMPLE HAS SECOND TEMPERATURE DIFFERENT THAN FIRST TEMPERATURE, SECOND SEM PROCESS ON SAMPLE TO GENERATE SECOND SEM MAP ⟋ 304

GENERATE, BASED UPON FIRST SEM MAP AND SECOND SEM MAP, DOPANT DISTRIBUTION MAP INDICATIVE OF FIRST DOPANT CONCENTRATION IN FIRST REGION OF SAMPLE AND SECOND DOPANT CONCENTRATION IN SECOND REGION OF SAMPLE ⟋ 306

FIG. 3

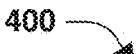
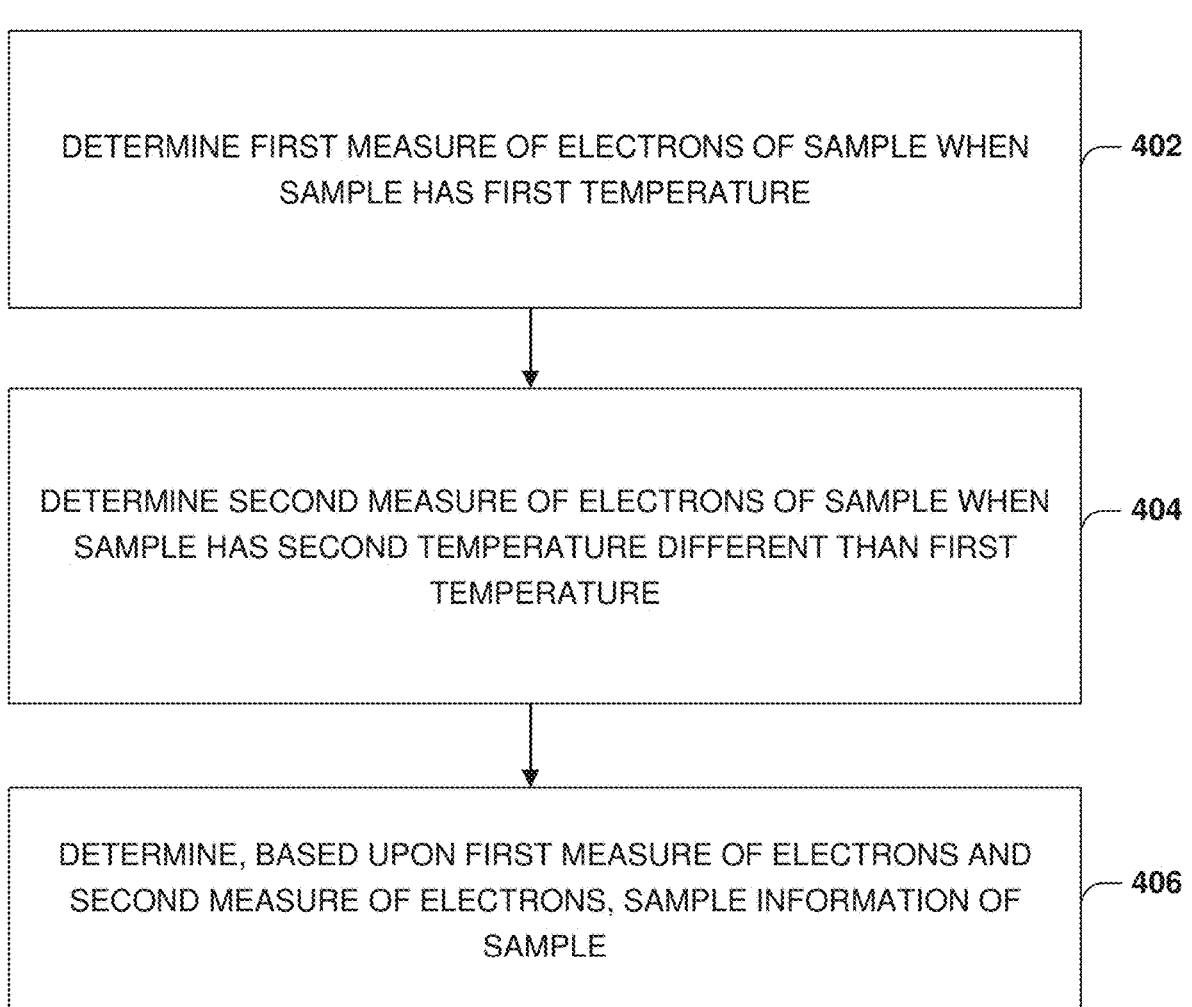
FIG. 4

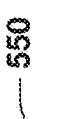
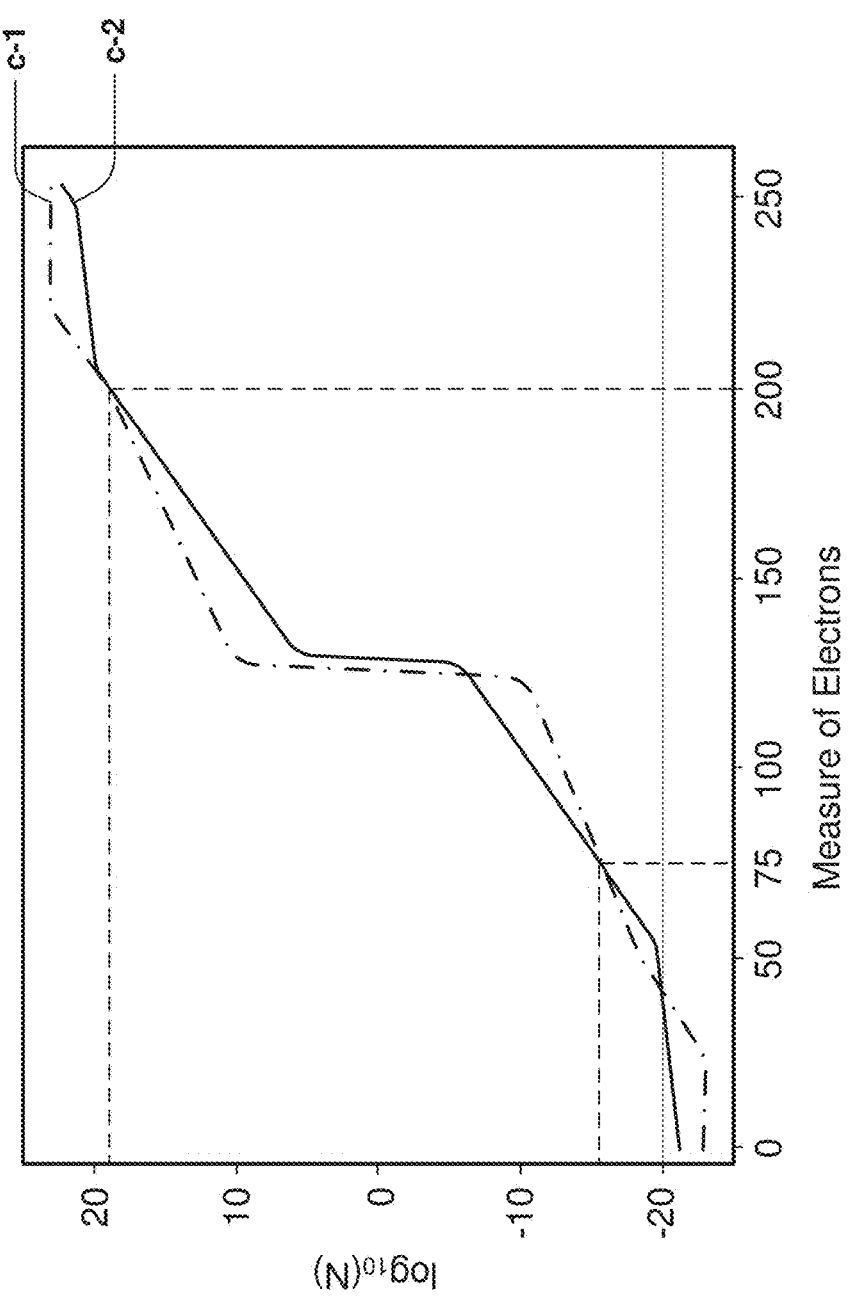
FIG. 5C

600 —

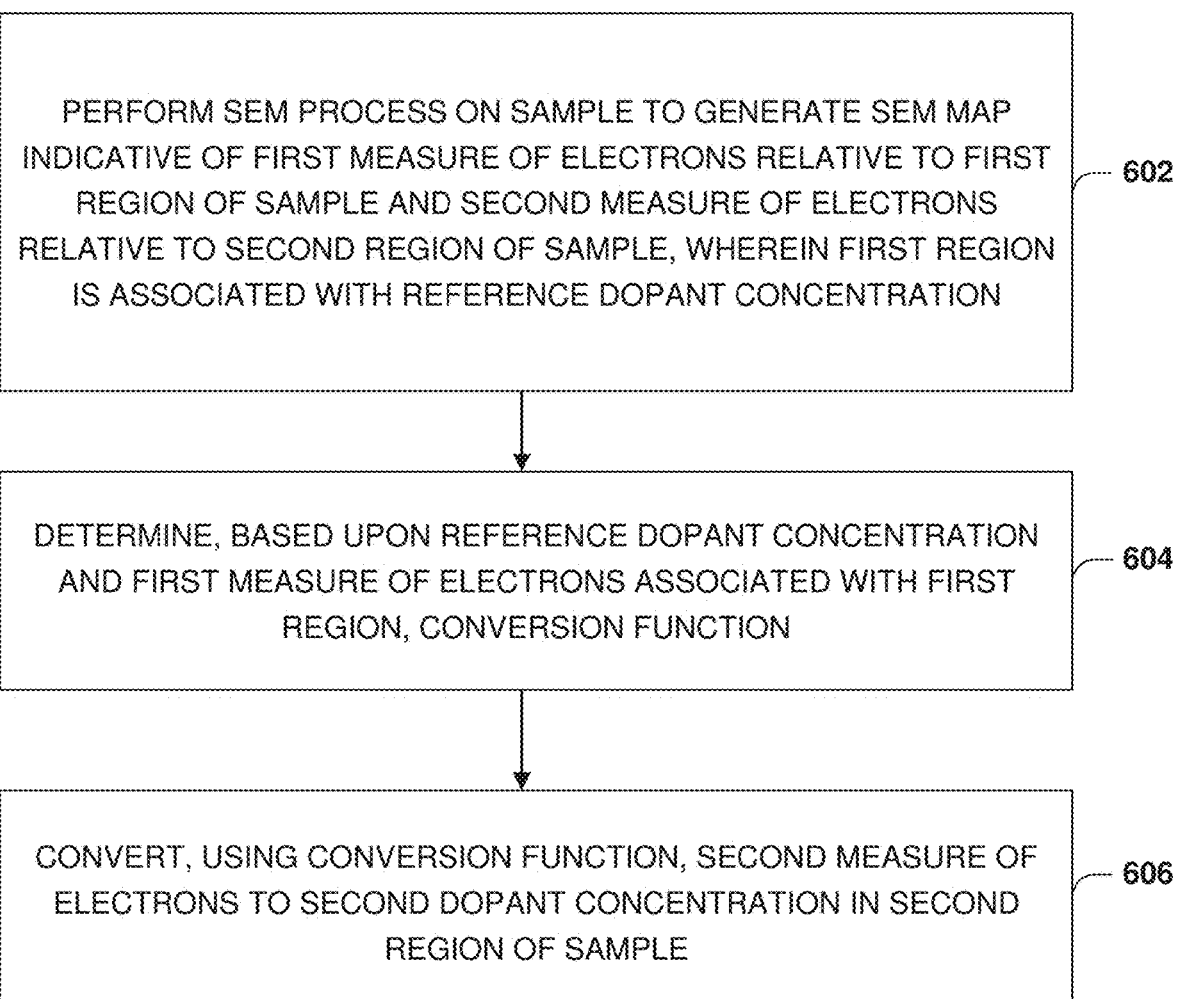

PERFORM SEM PROCESS ON SAMPLE TO GENERATE SEM MAP INDICATIVE OF FIRST MEASURE OF ELECTRONS RELATIVE TO FIRST REGION OF SAMPLE AND SECOND MEASURE OF ELECTRONS RELATIVE TO SECOND REGION OF SAMPLE, WHEREIN FIRST REGION IS ASSOCIATED WITH REFERENCE DOPANT CONCENTRATION    — 602

DETERMINE, BASED UPON REFERENCE DOPANT CONCENTRATION AND FIRST MEASURE OF ELECTRONS ASSOCIATED WITH FIRST REGION, CONVERSION FUNCTION    — 604

CONVERT, USING CONVERSION FUNCTION, SECOND MEASURE OF ELECTRONS TO SECOND DOPANT CONCENTRATION IN SECOND REGION OF SAMPLE    — 606

FIG. 6

700 —
702 —
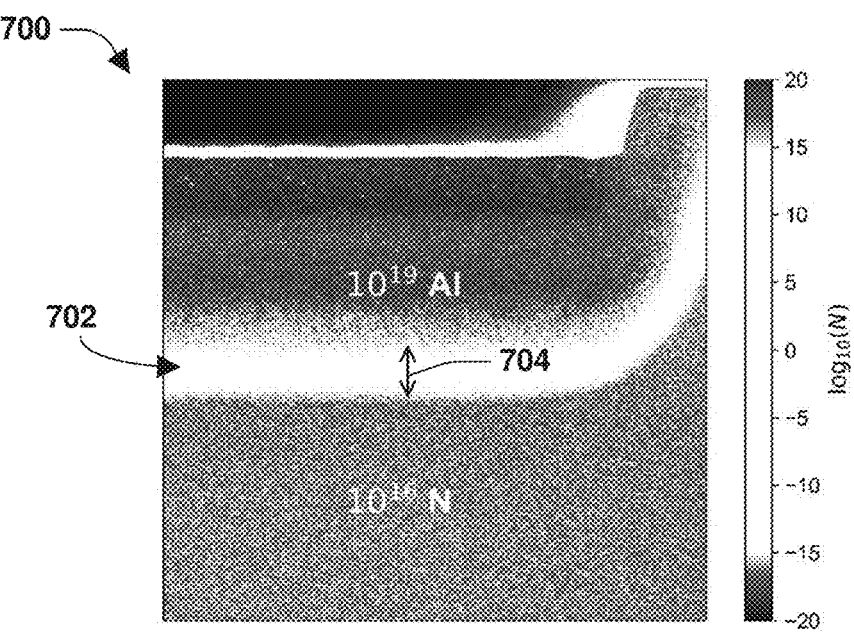
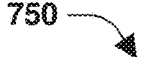
FIG. 7A
750 —
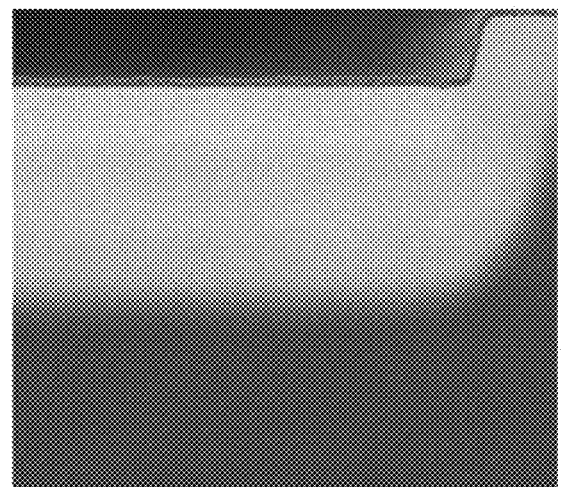
FIG. 7B

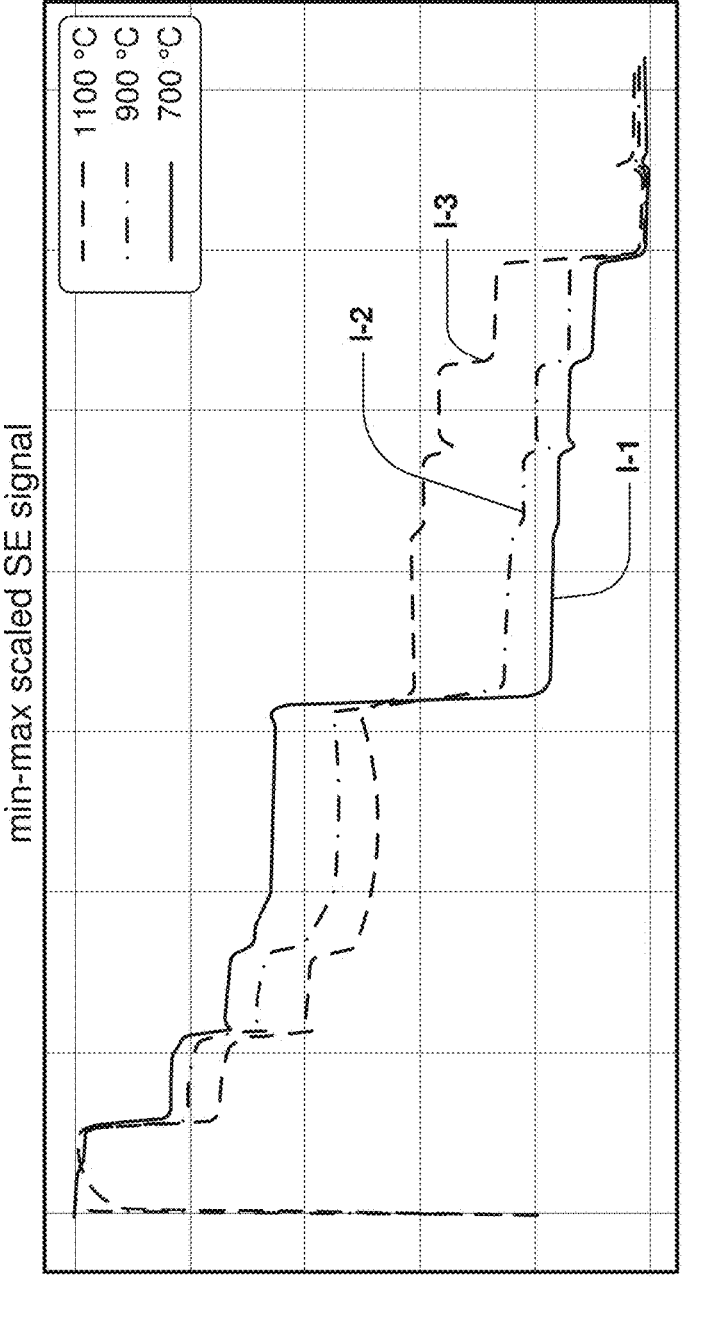
FIG. 8

SCANNING ELECTRON MICROSCOPY-BASED SAMPLE ANALYSIS

TECHNICAL FIELD

The present disclosure relates to semiconductor devices.

BACKGROUND

A semiconductor device may be used in mobile phones, laptops, desktops, tablets, watches, gaming systems, industrial electronics, commercial electronics, and/or consumer electronics. A semiconductor device may comprise an electrical contact between a semiconductor and a metal that may be used to connect a component within the semiconductor device to external circuitry.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method of determining a dopant distribution map associated with a sample is provided. When a sample has a first temperature, a first scanning electron microscopy (SEM) process is performed on the sample to generate a first SEM map. When the sample has a second temperature different than the first temperature, a second SEM process is performed on the sample to generate a second SEM map. A dopant distribution map is generated based upon the first SEM map and the second SEM map. The dopant distribution map is indicative of a first dopant concentration in a first region of the sample and a second dopant concentration in a second region of the sample.

In an embodiment, a system is provided that includes means for performing, when a sample has a first temperature, a first scanning electron microscopy (SEM) process on the sample to generate a first SEM map, means for performing, when the sample has a second temperature different than the first temperature, a second SEM process on the sample to generate a second SEM map, and means for generating, based upon the first SEM map and the second SEM map, a dopant distribution map indicative of a first dopant concentration in a first region of the sample and a second dopant concentration in a second region of the sample.

In an embodiment, a method of determining sample information associated with a sample is provided. When a sample has a first temperature, a first measure of electrons of the sample is determined. When the sample has a second temperature different than the first temperature, a second measure of electrons of the sample is determined. Sample information associated with the sample is determined based upon the first measure of electrons and the second measure of electrons. The sample information comprises a dopant concentration of the sample, a measure of electric field strength of the sample, a defect concentration of the sample, a Fermi level of the sample, and/or an indication of a space charge region of the sample.

In an embodiment, a system is provided that includes means for determining a first measure of electrons of a sample when the sample has a first temperature, means for determining a second measure of electrons of the sample when the sample has a second temperature different than the first temperature, and means for determining, based upon the first measure of electrons and the second measure of electrons, sample information, associated with the sample, comprising at least one of a dopant concentration of the sample, a measure of electric field strength of the sample, a defect concentration of the sample, a Fermi level of the sample, or an indication of a space charge region of the sample.

In an embodiment, a method of determining a dopant concentration associated with a sample is provided. A SEM process is performed on a sample to generate a SEM map indicative of a first measure of electrons relative to a first region of the sample and a second measure of electrons relative to a second region of the sample. A conversion function is determined based upon the reference dopant concentration and the first measure of electrons associated with the first region. The second measure of electrons is converted to a second dopant concentration in the second region of the sample.

In an embodiment, a system is provided that includes means for performing a scanning electron microscopy (SEM) process on a sample to generate a SEM map indicative of a first measure of electrons relative to a first region of the sample and a second measure of electrons relative to a second region of the sample, wherein the first region is associated with a reference dopant concentration, means for determining, based upon the reference dopant concentration and the first measure of electrons associated with the first region, a conversion function, and means for converting, using the conversion function, the second measure of electrons to a second dopant concentration in the second region of the sample.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 1A schematically illustrates an act of determining sample information of a semiconductor device according to various examples.

FIG. 1D schematically illustrates an act of determining sample information of a semiconductor device according to various examples.

FIG. 2A is a schematic band diagram showing example relationships between various energy levels.

FIG. 3 is an illustration of an example method in accordance with at least some of the techniques presented herein.

FIG. 4 is an illustration of an example method in accordance with at least some of the techniques presented herein.

FIG. 5C is a data set representative of a conversion function associated with converting a measure of electrons to a dopant concentration.

FIG. 6 is an illustration of an example method in accordance with at least some of the techniques presented herein.

FIG. 7A is an example dopant distribution map.

FIG. 7B is an example scanning electron microscopy (SEM) map.

FIG. 8 is a data set representative of line profiles of SEM maps.

DETAILED DESCRIPTION

Figure 1B:
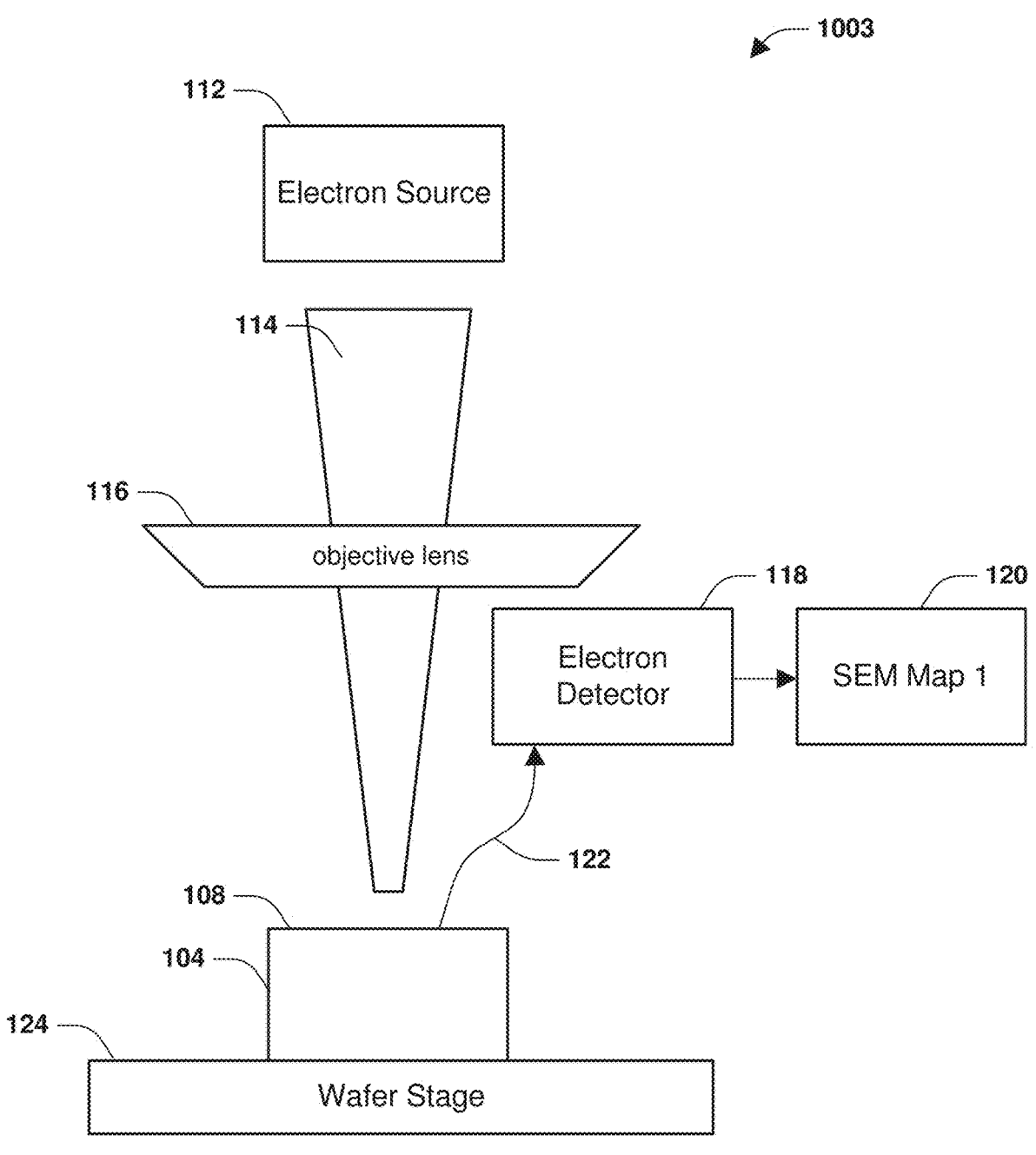
FIG. 1B schematically illustrates an act of determining sample information of a semiconductor device according to various examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most) 6° with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

Accurate dopant information is useful in semiconductor technology. Dopant information may be used to design semiconductor devices, test semiconductor wafers and/or determine device functionalities. In some embodiments, one or more scanning electron microscopy (SEM) processes may be performed on a sample to generate one or more SEM maps. In accordance with the techniques provided herein, dopant information (e.g., a dopant distribution map) associated with the sample may be determined based upon the one or more SEM maps. In an example, SEM processes may be performed on the sample at different temperatures to generate a plurality of SEM maps associated with a plurality of temperatures. The plurality of SEM maps may comprise a first SEM map generated via a first SEM process performed on the sample when the sample has a first temperature, a second SEM map generated via a second SEM process performed on the sample when the sample has a second temperature, and/or one or more other SEM maps associated with one or more other temperatures. In an example, the first SEM map may indicate a first measure of electrons relative to a first region of the sample, and/or the second SEM map may indicate a second measure of electrons relative to the first region. In some examples, measures of electrons indicated by the plurality of SEM maps are temperature dependent such that the first measure of electrons associated with the first temperature is different than the second measure of electrons associated with the second temperature. In an example, a temperature-based slope associated with a change in measure of electrons over temperature may be determined based upon the first measure of electrons, the second measure of electrons and/or one or more other measures of electrons associated with the first region. A dopant concentration in the first region may be determined based upon the temperature-based slope.

In an embodiment of the presently disclosed embodiments, a method of determining dopant concentrations associated with a sample is provided. The sample may comprise at least a portion of a semiconductor wafer (e.g., some and/or all of the semiconductor wafer). In some examples, the sample may comprise a filled electron valence band. The method may comprise performing SEM processes on the sample at different temperatures to generate a plurality of SEM maps associated with a plurality of temperatures. Any number of SEM maps of the plurality of SEM maps are within the scope of the present disclosure. For example, the plurality of SEM maps may comprise two SEM maps associated with two temperatures, three SEM maps associated with three temperatures, ten SEM maps associated with ten temperatures, or any other number of SEM maps.

In some examples, an SEM map of the plurality of SEM maps (e.g., each SEM map of the plurality of SEM maps) may be a secondary electron dopant contrast (SEDC) map (e.g., the SEM map may be representative of a SEDC of the sample, for example). For example, the plurality of SEM maps may be generated using an SEDC configuration of a scanning electron microscope (SEM). It may be appreciated that using SEM and/or SEDC to generate the plurality of SEM maps provides for at least one of higher spatial resolution, simpler sample preparation, larger range of detectable dopant concentrations and/or scalability for production use as compared with signals generated using other techniques (other than SEM and/or SEDC) such as at least one of atomic force microscopy (AFM) based techniques (e.g., scanning spreading resistance microscopy (SSRM)

and/or scanning capacitance microscopy), chemical methods (e.g., secondary ion mass spectroscopy (SIMS)), etc.

In some examples, the plurality of SEM maps may comprise a first SEM map associated with a first temperature of the plurality of temperatures. The first SEM map may be generated via performing a first SEM process on the sample when the sample has the first temperature.

The first SEM process may comprise (i) emitting a first electron beam (e.g., a first primary electron beam) to the sample when the sample has the first temperature, (ii) detecting first electrons emitted from the sample via interactions of electrons of the first electron beam with the sample, (iii) determining a first measure of electrons based upon the (detected) first electrons, and/or (iv) generating the first SEM map based upon the first measure of electrons. In some examples, a first bias (e.g., a first sample bias) is applied to the sample during the first SEM process.

In an example, the first measure of electrons corresponds to a first region of the sample (e.g., the first electrons may be emitted from the first region of the sample), and may be indicated by a pixel value of a pixel, of the first SEM map, corresponding to the first region. In some examples, the first electrons comprise secondary electrons (which may be detected using a secondary electron detector, for example). In an example, the first measure of electrons corresponds to a measure of secondary electrons relative to the first region. In some examples, at least some of the first electrons (e.g., the secondary electrons) originate from a valence band of the sample. In some examples, it may be assumed that all (or at least a threshold proportion) of the secondary electrons detected using the secondary electron detector originate energetically from a valence band of the sample. In an example in which the sample comprises silicon carbide (SiC), a concentration of electrons in a conduction band of the sample may be less than (e.g., less than half of) a concentration of silicon and carbon atoms in the conduction band. In some examples, it may be assumed that the sample has a flat-band condition towards a vacuum implemented in the first SEM process and/or the first electron beam, such as due, at least in part, to (i) generation of electron-hole pairs via inelastic scattering of primary electrons (e.g., electrons of the first electron beam) with valence electrons (e.g., secondary electrons in the valence band) and/or (ii) the generated electron-hole pairs (and/or electrons) filling surface states.

In some examples, the plurality of SEM maps may comprise a second SEM map associated with a second temperature of the plurality of temperatures. The second temperature is different than the first temperature. The second SEM map may be generated via performing a second SEM process on the sample when the sample has the second temperature.

The second SEM process may comprise (i) emitting a second electron beam (e.g., a second primary electron beam) to the sample when the sample has the second temperature, (ii) detecting second electrons emitted from the sample via interactions of electrons of the second electron beam with the sample, (iii) determining a second measure of electrons based upon the (detected) second electrons, and/or (iv) generating the second SEM map based upon the second measure of electrons. In some examples, a second bias (e.g., a second sample bias) is applied to the sample during the second SEM process.

In an example, the second measure of electrons corresponds to a second region of the sample (e.g., the second electrons may be emitted from the second region of the sample), and may be indicated by a pixel value of a pixel, of the second SEM map, corresponding to the second region. In some examples, the second electrons comprise secondary electrons (which may be detected using a secondary electron detector, for example). In an example, the second measure of electrons corresponds to a measure of secondary electrons relative to the second region. In some examples, at least some of the second electrons (e.g., the secondary electrons) originate from the valence band of the sample. One or more other SEM maps (other than the first SEM map and the second SEM map) of the plurality of SEM maps are generated using one or more of the techniques provided herein with respect to generating the first SEM map and/or generating the second SEM map.

In some examples, a dopant distribution map is generated based upon the plurality of SEM maps. In some examples, the dopant distribution map is indicative of a plurality of dopant concentrations relative to a plurality of regions of the sample. The plurality of dopant concentrations may comprise a first dopant concentration in a first region of the sample and a second dopant concentration in a second region of the sample. In some examples, the first dopant concentration is determined based upon measures of electrons, associated with the first region, indicated by the plurality of SEM maps. The second dopant concentration may be determined based upon measures of electrons, associated with the second region, indicated by the plurality of SEM maps.

In an example, the first dopant concentration may be determined based upon a set of measures of electrons comprising (i) the first measure of electrons (associated with the first region) indicated by the first SEM map, (ii) the second measure of electrons (associated with the first region) indicated by the second SEM map, and/or (iii) one or more other measures of electrons, associated with the first region, indicated by one or more other SEM maps of the plurality of SEM maps. In some examples, measures of electrons of the plurality of SEM maps are temperature dependent such that the first measure of electrons associated with the first temperature is different than the second measure of electrons associated with the second temperature. In some examples, an impact of the temperature difference on the determined measures of electrons may be reflective of a dopant concentration (e.g., the first dopant concentration) of the sample. For example, a temperature-based slope associated with a change in measure of electrons over temperature (e.g., the temperature-based slope may correspond to $\Delta m/\Delta T$, wherein $\Delta m$ may correspond to a difference between the first measure of electrons and the second measure of electrons and/or $\Delta T$ may correspond to a difference between the first temperature and the second temperature) may be determined based upon the set of measures associated with the first region. The first dopant concentration in the first region may be determined based upon the temperature-based slope (e.g., the temperature-based slope may be correlated to the first dopant concentration).

In some examples, SEM processes performed to generate maps of the plurality of SEM maps may be performed using different sample bias values (e.g., the first bias associated with the first SEM process may be different than the second bias associated with the second SEM process). In some examples, measures of electrons of the plurality of SEM maps are bias dependent such that the first measure of electrons associated with the first bias is different than the second measure of electrons associated with the second bias. In some examples, an impact of the bias difference on the determined measures of electrons may be reflective of a dopant concentration (e.g., the first dopant concentration) of the sample. For example, a bias-based slope associated with a change in measure of electrons over bias (e.g., the bias-based slope may correspond to Δm/ΔB, wherein Δm may correspond to a difference between the first measure of electrons and the second measure of electrons and/or ΔB may correspond to a difference between the first bias and the second bias) may be determined based upon the set of measures associated with the first region. The first dopant concentration in the first region may be determined based upon the bias-based slope (e.g., the bias-based slope may be correlated to the first dopant concentration). In some examples, the first dopant concentration may be determined based upon the temperature-based slope and the bias-based slope.

Alternatively and/or additionally, energy differences associated with the sample may be determined based upon the set of measures associated with the first region. In some examples, the energy differences may comprise a first energy difference determined based upon the first measure of electrons, a second energy difference determined based upon the second measure of electrons and/or one or more other energy differences determined based upon one or more other measures of the set of measures associated with the first region. In an example, the first energy difference corresponds to a difference between a first Fermi level associated with the sample and a first valence band energy level associated with the sample. The second energy difference may correspond to a difference between a second Fermi level associated with the sample and a second valence band energy level associated with the sample.

In some examples, the energy differences associated with the sample are temperature dependent such that the first energy difference (derived from the first measure of electrons, for example) associated with the first temperature is different than the second energy difference (derived from the second measure of electrons, for example) associated with the second temperature. In some examples, an impact of the temperature difference on the determined energy differences may be reflective of a dopant concentration (e.g., the first dopant concentration) of the sample. For example, a second temperature-based slope associated with a change in energy differences over temperature (e.g., the second temperature-based slope may correspond to ΔD/ΔT, wherein ΔD may correspond to a difference between the first energy difference and the second energy difference and/or ΔT may correspond to a difference between the first temperature and the second temperature) may be determined based upon the energy differences associated with the first region. The first dopant concentration in the first region may be determined based upon the second temperature-based slope (e.g., the second temperature-based slope may be correlated to the first dopant concentration).

In some examples, the energy differences associated with the sample are bias dependent such that the first energy difference (derived from the first measure of electrons, for example) associated with the first bias is different than the second energy difference (derived from the second measure of electrons, for example) associated with the second bias. In some examples, an impact of the bias difference on the determined energy differences may be reflective of a dopant concentration (e.g., the first dopant concentration) of the sample. For example, a second bias-based slope associated with a change in energy differences over bias (e.g., the second bias-based slope may correspond to ΔD/ΔB, wherein ΔD may correspond to a difference between the first energy difference and the second energy difference and/or ΔB may correspond to a difference between the first bias and the second bias) may be determined based upon the energy differences associated with the first region. The first dopant concentration in the first region may be determined based upon the second bias-based slope (e.g., the second bias-based slope may be correlated to the first dopant concentration).

In some examples, other dopant concentrations (other than the first dopant concentration) of the plurality of dopant concentrations may be determined using one or more of the techniques provided herein with respect to determining the first dopant concentration. Alternatively and/or additionally, in response to determining the first dopant concentration associated with the first region, the first dopant concentration may be used as a reference dopant concentration to determine a conversion function (e.g., the conversion function may be determined based upon the first dopant concentration in the first region and a measure of electrons relative to the first region). In some examples, the conversion function may be used to convert measures of electrons indicated by a SEM map to dopant concentrations. In an example, a SEM map of the plurality of SEM maps (e.g., the first SEM map and/or the second SEM map) may be indicative of a measure of electrons relative to the second region. The conversion function may be applied to the measure of electrons associated with the second region to determine the second dopant concentration in the second region.

Thus, in accordance with some embodiments of the present disclosure, dopant concentrations (and/or the dopant distribution map) associated with the sample may be determined (automatically and/or without manual intervention, for example) based upon the plurality of SEM maps associated with the plurality of temperatures. In some examples, other sample information (other than dopant concentrations, for example) associated with the sample may be determined using the techniques provided herein. For example, measures of electric field strength in regions of the sample (and/or an electric field strength map indicative of the measures of electric field strength) may be determined using one or more of the techniques provided herein with respect to determining dopant concentrations (and/or the dopant distribution map). Alternatively and/or additionally, defect concentrations in regions of the sample (and/or a defect concentration map indicative of the defect concentrations) may be determined using one or more of the techniques provided herein with respect to determining dopant concentrations (and/or the dopant distribution map).

In an embodiment of the presently disclosed embodiments, a method of determining sample information of a sample is provided. The sample may comprise at least a portion of a semiconductor wafer (e.g., some and/or all of the semiconductor wafer). The sample may comprise a filled electron valence band. The method may comprise determining a first measure of electrons of the sample when the sample has a first temperature. The method may comprise determining a second measure of electrons of the sample when the sample has a second temperature. The sample information may be determined based upon the first measure of electrons and the second measure of electrons. The sample information may be indicative of a dopant concentration of the sample, a measure of electric field strength of the sample, a defect concentration of the sample, a Fermi level of the sample, and/or an indication of a space charge region of the sample.

In some examples, the method may comprise emitting a first electron beam to the sample when the sample has the first temperature, and/or detecting first electrons emitted from the sample via interactions of electrons of the first electron beam with the sample. The first measure of electrons may be determined based upon the (detected) first electrons (e.g., secondary electrons). The method may comprise emitting a second electron beam to the sample when the sample has the second temperature, and/or detecting second electrons emitted from the sample via interactions of electrons of the second electron beam with the sample. The second measure of electrons may be determined based upon the (detected) second electrons (e.g., secondary electrons).

In some examples, the sample information comprises a map (e.g., a dopant distribution map) indicative of a dopant distribution associated with the sample (e.g., a distribution of dopant concentrations across a plurality of regions of the sample). In some examples, the sample information comprises a map (e.g., an electric field strength distribution map) indicative of an electric field strength distribution associated with the sample (e.g., a distribution of electrical field strengths across a plurality of regions of the sample). In some examples, the sample information comprises a map (e.g., a Fermi level energy distribution map) indicative of a Fermi level energy distribution associated with the sample (e.g., a distribution of Fermi levels across a plurality of regions of the sample). In some examples, the sample information comprises a map indicative of a space charge region associated with the sample.

In an embodiment of the presently disclosed embodiments, a method of determining a dopant concentration associated with a sample is provided. The sample may comprise at least a portion of a semiconductor wafer (e.g., some and/or all of the semiconductor wafer). In some examples, the sample may comprise a filled electron valence band. The method may comprise performing a SEM process on a sample to generate a SEM map. The SEM map may be indicative of a first measure of electrons relative to a first region of the sample and a second measure of electrons relative to a second region of the sample. The first region may be associated with a reference dopant concentration (e.g., the reference dopant concentration corresponding to the first region may be predefined and/or known).

A conversion function may be determined based upon the reference dopant concentration and the first measure of electrons associated with the first region. In some examples, the conversion function is determined based upon an energy difference corresponding to a difference between a Fermi level associated with the sample and a valence band energy level associated with the sample. The energy difference may be determined based upon the first measure of electrons. In some examples, measures of electrons indicated by the SEM map may be converted to dopant concentrations. The conversion function may be used to (i) convert the second measure of electrons to a second dopant concentration in the second region of the sample, (ii) convert a third measure of electrons indicated by the SEM map to a third dopant concentration in a third region of the sample, and/or (iii) convert one or more other measures indicated by the SEM map to one or more dopant concentrations. In some examples, a dopant distribution map may be generated based upon dopant concentrations determined using the conversion function.

FIGS. 1A-1D illustrate aspects with respect to determining sample information of a sample according to various examples of the present disclosure. The sample may comprise semiconductor material (e.g., crystalline semiconductor material). The sample may comprise a semiconductor element (e.g., silicon, germanium, and/or other semiconductor element) and/or a semiconductor compound (e.g., SiC, silicon germanium (SiGe), gallium arsenide (GaAs), gallium nitride (GaN) and/or other semiconductor compound). The sample may comprise dopants (e.g., nitrogen (N), phosphorus (P), beryllium (Be), boron (B), aluminum (Al), gallium (Ga) and/or other dopants). Alternatively and/or additionally, the sample may comprise impurities (e.g., hydrogen, fluorine, oxygen and/or other impurities). In some examples, a conductivity of the sample meets (e.g., exceeds) a threshold conductivity. In some examples, the threshold conductivity may be in the range of at least $0.000001$ ohm$^{-1}$ centimeter$^{-1}$ (cm$^{-1}$) to at most $0.0001$ ohm$^{-1}$ cm$^{-1}$. In some examples, the sample comprises semiconductor material and dielectric material (e.g., one or more dielectric layers).

In some examples, the sample comprises at least a portion of a semiconductor wafer. For example, the sample may comprise some of the semiconductor wafer (e.g., the sample may comprise a wafer piece) or all of the semiconductor wafer. The semiconductor wafer may comprise a semiconductor substrate, such as at least one of a silicon substrate, a SiC substrate, etc. Acts 1001 and/or 1002 in FIG. 1A illustrate preparation of the sample (shown with reference number 104) according to some embodiments. At 1001 (illustrated in FIG. 1A), a semiconductor wafer 102 is provided. At 1002 (illustrated in FIG. 1A), the semiconductor wafer 102 is cleaved (e.g., cleaved in air) to divide the semiconductor wafer 102 into multiple parts comprising the sample 104 (e.g., a first semiconductor wafer) and/or a portion 106 (e.g., a second semiconductor wafer). Cleaving the semiconductor wafer 102 may produce (and expose, for example) a surface 108 of the sample 104 (e.g., the surface 108 may correspond to a cross-section of the semiconductor wafer 102). In an example, the semiconductor wafer 102 comprises a region (e.g., a doped region, an ion implanted region, a diffused region and/or an epitaxially grown region) and/or the surface 108 may correspond to a cross-section through the region. The sample 104 may comprise a semiconductor substrate (e.g., at least one of a silicon substrate, a SiC substrate, etc.), one or more layers over the substrate (e.g., one or more semiconductor layers, one or more epitaxial layers, one or more dielectric layers, etc.), one or more diodes, one or more transistors (e.g., an insulated-gate bipolar transistor (IGBT), a field-effect transistor (FET), a metal-oxide-semiconductor FET (MOSFET) and/or other type of transistor), etc. The sample 104 may comprise a filled electron valence band. Although FIG. 1A shows an example in which the sample 104 comprises at least a portion of a semiconductor wafer, embodiments are contemplated in which the sample comprises an object different than a semiconductor wafer.

At 1003 (illustrated in FIG. 1B), a first SEM process is performed on the sample 104 to generate a first scanning electron microcopy map 120. In some examples, the first SEM process is performed using a first scanning electron microscope. In some examples, the first SEM process comprises emitting a first electron beam 114 to the sample 104. Electrons of the first electron beam 114 may impinge upon a top surface (e.g., the surface 108) of the sample 104. In some examples, the first electron beam 114 may scan the top surface (e.g., the surface 108) of the sample 104 (e.g., the first electron beam 114 may scan an entirety of the surface 108 or a portion of the surface 108) in a raster pattern or other scanning pattern. The first electron beam 114 may be generated using an electron source 112 of the first scanning electron microscope. In some examples, the first scanning electron microscope may comprise an objective lens 116 (and/or one or more other lenses) to control a path of electrons of the first electron beam 114 (e.g., the first scanning electron microscope may use the objective lens 116 and/or the one or more other lenses to control at least one of a size, a position, an energy level, etc. of the first electron beam 114). The objective lens 116 may comprise an electromagnetic lens (and/or the one or more other lenses may comprise one or more electromagnetic lenses).

The sample 104 may have a first temperature during the first SEM process. In some examples, the first temperature may be in the range of at least 10° Celsius to at most 1200° Celsius, in the range of at least 10° Celsius to at most 600° Celsius, and/or in the range of at least 600° Celsius to at most 1100° Celsius. At least a portion of the sample 104 may be heated (using the first scanning electron microscope, for example) to the first temperature. In an example, the sample 104 may be set upon and/or supported by a sample stage 124 (e.g., a wafer stage, a heating stage, and/or a high vacuum heating stage (HVHS)) of the first scanning electron microscope. In some examples, the sample 104 may be attached to the sample stage 124 using an adhesive (e.g., silver glue). The adhesive may be dried (prior to the first SEM process, for example) in an oven (e.g., a nitrogen flooded oven) at a temperature in the range of at least 40° Celsius to at most 80° Celsius. The sample stage 124 may control a position of the sample 104 (e.g., the sample stage 124 may move the sample 104 using a motor, such as a stepper motor, of the first scanning electron microscope). In some examples, prior to and/or during the first SEM process, the sample stage 124 may direct thermal energy to the sample 104 to heat (via in-situ heating, for example) the sample 104. In an example, the thermal energy may be provided by a heater associated with the sample stage 124 (e.g., the sample stage 124 may comprise and/or be connected to the heater). In some examples, the heater may comprise a resistive heating element.

In some examples, the sample 104 is heated to the first temperature prior to the first SEM process. In an example, the first SEM process may be initiated (e.g., the first electron beam 114 may be generated and/or emitted towards the sample 104) in response to a determination that a temperature of at least a portion of the sample 104 reached the first temperature. In some examples, the sample 104 is heated (e.g., in-situ heating using the sample stage 124) during the first SEM process. In some examples, at least a portion of the sample 104 has the first temperature during a section of the first SEM process. In some examples, at least a portion of the sample 104 has the first temperature during an entirety of the first SEM process.

In some examples, the first electron beam 114 may be generated based upon one or more first SEM parameters associated with the first SEM process. The one or more first SEM parameters may be controlled based upon one or more characteristics of the sample 104. In an example, the one or more characteristics may comprise a conductivity of the sample 104. The one or more first SEM parameters may be indicative of a first beam current (e.g., a primary beam current) of the first electron beam 114, a first duration of the first SEM process, a first acceleration voltage of the first SEM process and/or a first extraction current of the first SEM process. For example, the first beam current and/or the first duration of the first SEM process may be controlled based upon the conductivity of the sample 104. In an example, the first beam current and/or the first duration may be a function of the conductivity, where an increase of the conductivity corresponds to (i) a decrease of the first beam current and/or (ii) an increase of the first duration (e.g., the first duration may correspond to an amount of time that the sample 104 is scanned by the first electron beam 114 in the first SEM process). In some examples, the first beam current may be in the range of at least 1 picoampere to at most 50 nanoamperes and/or in the range of at least 1 picoampere to at most 200 picoamperes. In some examples, the first acceleration voltage may be in the range of at least 100 volts to at most 5 kilovolts and/or in the range of at least 500 volts to at most 1.5 kilovolts. In some examples, the first extraction current may be in the range of at least 2 microamperes to at most 10 microamperes. The first extraction current may be indicative of the first beam current (e.g., the first beam current, which is smaller than the first extraction current, may depend upon the first extraction current).

In some examples, a first bias (e.g., a first sample bias) is applied to the sample 104 during the first SEM process. For example, the first bias may be applied to the sample 104 during a section of the first SEM process and/or during the entirety of the first SEM process. In some examples, the first bias is a direct current (DC) bias (e.g., a DC voltage may be applied to the sample 104). Alternatively and/or additionally, the first bias may be a radio frequency (RF) bias. In some examples, the first bias may be in the range of at least 0 volts to at most 50 volts (and/or in the range of at least −50 volts to at most 0 volts). In some examples, the first bias is applied to the sample 104 via a voltage source associated with the first scanning electron microscope. In some examples, the sample stage 124 comprises and/or is connected to the voltage source (e.g., the voltage source may be connected to the sample 104 via the sample stage 124 and/or may apply the first bias to the sample 104 via the sample stage 124). In some examples, the voltage source corresponds to an internal voltage supply (of the first scanning electron microscope, for example) or an external voltage supply. In some examples, a first terminal (e.g., positive terminal) of the voltage source may be coupled to a first portion of the sample 104 and/or a first portion of the sample stage 124 (e.g., the first terminal of the voltage source may be coupled to a first terminal of the sample 104 and/or a first terminal of the sample stage 124) and/or a second terminal (e.g., negative terminal) of the voltage source may be coupled to a second portion of the sample 104 and/or a second portion of the sample stage 124 (e.g., the second terminal of the voltage source may be coupled to a second terminal of the sample 104 and/or a second terminal of the sample stage 124), wherein the first portion of the sample 104 is different than (and/or separated and/or electrically isolated from) the second portion of the sample 104. The first bias may be applied to the sample 104 via the first terminal and the second terminal of the voltage source. In some examples, the first bias corresponds to a stage bias of the sample stage 124. In some examples, the first bias may correspond to a difference between an output voltage of the voltage source and a voltage of a heat shield of the sample stage 124 (e.g., the HVHS). In an example, the voltage of the heat shield may be 43 volts, the output voltage of the voltage source may be 50 volts, and/or the first bias may correspond to 7 volts (e.g., 50 subtracted by 43).

In some examples, the sample 104 and/or the first sample stage 124 are disposed in a chamber (e.g., a vacuum chamber) of the first scanning electron microscope during the first SEM process. In some examples, the chamber may comprise a vacuum sealed space. The first scanning electron microscope may be configured to establish, maintain and/or preserve a vacuum in the chamber (e.g., the vacuum sealed space) during the first SEM process.

In some examples, an electron detector 118 of the first scanning electron microscope is used to detect first electrons 122 emitted from the sample 104 during the first SEM process. The first electrons 122 may be emitted (e.g., ejected) from the sample 104 via interactions of electrons of the first electron beam 114 with the sample 104. A first measure of electrons may be determined based upon the first electrons 122 detected using the electron detector 118. In an example, the first electrons 122 may comprise secondary electrons. The electron detector 118 of the first scanning electron microscope may comprise a secondary electron detector. The secondary electrons may be ejected from the sample 104 via inelastic scattering interactions with electrons of the first electron beam 114. In some examples, the secondary electrons (e.g., all of the secondary electrons) originate (e.g., energetically originate) from a valence band of the sample 104. In some examples, the secondary electrons comprise low-energy electrons (e.g., electrons associated with energy levels lower than 50 electronvolts). In some examples, the secondary electrons originate from regions (of the sample 104) that are within a threshold distance (e.g., 10 nanometers) of the top surface (e.g., the surface 108) of the sample 104. In some examples, the first electrons 122 detected using the electron detector 118 include only the secondary electrons (and/or the first electrons 122 do not include one or more other types of electrons emitted from the sample 104, such as backscattered electrons). For example, the first measure of electrons may correspond to a measure of secondary electrons emitted from the sample 104 (during the first SEM process, for example). Embodiments are contemplated in which the first electrons 122 include one or more other types of electrons emitted from the sample 104 other than the secondary electrons, such as backscattered electrons (e.g., the first electrons 122 detected using the electron detector 118 may include the secondary electrons and the backscattered electrons).

In some examples, the electron detector 118 and/or first scanning electron microscope may be configured for SEDC operation. In some examples, the first scanning electron microcopy map 120 may comprise a first SEDC map (e.g., the first scanning electron microcopy map 120 may be generated using an SEDC configuration of the first scanning electron microscope).

In some examples, application of the first bias to the sample 104 may act as a high pass filter for secondary electron energies. For example, low-energy secondary electrons associated with energy levels lower than a threshold energy level may be filtered (such that the low-energy secondary electrons are not detected by the electron detector 118, for example). The threshold energy level may be based upon the first bias (e.g., the threshold energy level may be a function of the first bias, wherein a higher voltage of the first bias may correspond to a higher value of the threshold energy level). It may be appreciated that application of the first bias (and/or filtering of the low-energy secondary electrons associated with energy levels lower than the threshold energy level) reduces noise (e.g., image artifacts and/or systematic distortion) at one or more regions of the sample 104. For example, application of the first bias may reduce noise (e.g., image artifacts and/or systematic distortion) at a p-n junction of the sample 104, where low-energy secondary electrons (associated with energy levels lower than the threshold energy level) are deflected by a voltage (e.g., a built-in voltage) of the p-n junction and do not reach the electron detector 118. Reducing noise at the one or more regions (e.g., the p-n junction) provides for increased accuracy of the first scanning electron microcopy map 120 and/or increased accuracy of sample information (e.g., a dopant distribution map associated with the sample 104) determined using the first scanning electron microcopy map 120. In some examples, application of the first bias to the sample 104 enables the first scanning electron microcopy map 120 to be used for determining (e.g., accurately determining) the sample information (e.g., the dopant distribution map). In an example, without application of the first bias to the sample 104, the first scanning electron microcopy map 120 may be produced with image artifacts and/or systematic distortion that make it difficult and/or impossible to determine the sample information accurately using the first scanning electron microcopy map 120.

In some examples, the first measure of electrons is associated with a first region of the sample 104. The first region may correspond to a portion of the top surface, such as the surface 108, of the sample 104. In some examples, the first electrons 122 may be emitted from the first region of the sample 104. The first measure of electrons associated with the first region may be determined based upon (i) energy levels of the first electrons 122 emitted from the first region, (ii) a quantity of electrons emitted from the first region, and/or (iii) an intensity of the first electrons 122 emitted from the first region. In an example, the first measure of electrons may correspond to an intensity of the first electrons 122 emitted from the first region (e.g., an intensity of secondary electrons emitted from the first region).

In some examples, the first scanning electron microcopy map 120 is indicative of a first plurality of measures of electrons associated with a first plurality of regions of the sample 104. For example, the first plurality of measures of electrons may comprise the first measure of electrons associated with the first region of the sample 104, a second measure of electrons associated with a second region of the sample 104 (e.g., a second region of the top surface of the sample 104), a third measure of electrons associated with a third region of the sample 104 (e.g., a third region of the top surface of the sample 104), etc. In some examples, other measures of electrons (other than the first measures of electrons) of the first plurality of measures of electrons may be determined using one or more of the techniques provided herein with respect to the first measure of electrons. In an example, the first scanning electron microcopy map 120 may correspond to a distribution map of an intensity of a signal (e.g., secondary electrons) being emitted from scanned regions of the first plurality of regions during the first SEM process. In some examples, in the first SEM process, each region of the first plurality of regions is scanned one or more times using the first electron beam 114. In some examples, each region of one, some and/or all of the first plurality of regions is scanned merely once using the first electron beam 114 (to reduce an impact of carbon deposition on the top surface, such as the surface 108, of the sample 104, for example). In some examples, the first scanning electron microcopy map 120 comprises a first image visually representative of the first plurality of measures of electrons associated with the first plurality of regions. For example, a pixel of the first image may correspond to a region (of the first plurality of regions) of the sample 104, wherein a color of the pixel may be generated based upon a measure of electrons (of the first plurality of measures of electrons) associated with the region (e.g., the color of the pixel is representative of the measure of electrons associated with the region). The first image may comprise a first pixel associated with the first region and/or a second pixel associated with the second region. A first color of the first pixel may be generated based upon the first measure of electrons associated with the first region and/or a second color of the second pixel may be generated based upon the second measure of electrons associated with the second region. In an example, the first image may be a gray-scale image. In some examples, the first pixel having a darker shade of gray than the second pixel may indicate that the first measure of electrons associated with the first region is greater than the second measure of electrons associated with the second region. Alternatively and/or additionally, the first pixel having a lighter shade of gray than the second pixel may indicate that the first measure of electrons associated with the first region is greater than the second measure of electrons associated with the second region.

At 1004 (illustrated in FIG. 1C), a second SEM process is performed on the sample 104 to generate a second scanning electron microcopy map 130. In some examples, the second scanning electron microcopy map 130 may comprise a second SEDC map (e.g., the second scanning electron microcopy map 130 may be generated using an SEDC configuration of the first scanning electron microscope). In some examples, the second SEM process is performed using the first scanning electron microscope (or a different scanning electron microscope). In some examples, the second SEM process comprises emitting a second electron beam 134 to the sample 104. Electrons of the second electron beam 134 may impinge upon the top surface (e.g., the surface 108) of the sample 104. In some examples, the second electron beam 134 may be generated and/or used to scan the top surface (e.g., the surface 108) of the sample 104 using one or more of the techniques proved herein with respect to the first electron beam 114.

The sample 104 may have a second temperature during the second SEM process. The second temperature may be different than the first temperature. In some examples, the second temperature may be in the range of at least 100° Celsius to at most 1300° Celsius and/or in the range of at least 700° Celsius to at most 1100° Celsius. In some examples, a difference between the first temperature and the second temperature (i) may be at least 10° Celsius, (ii) may be at least 50° Celsius, (iii) may be at least 100° Celsius, (iv) may be in the range of at least 100° Celsius to at most 900° Celsius, and/or (v) may be in the range of at least 10° Celsius to at most 50° Celsius. At least a portion of the sample 104 may be heated (e.g., in-situ heating) to the second temperature (using the sample stage 124, for example), such as using one or more of the techniques provided herein with respect to heating the sample 104 for the first SEM process. In some examples, the sample 104 is heated to the second temperature prior to the second SEM process. In an example, the second SEM process may be initiated (e.g., the second electron beam 134 may be generated and/or emitted towards the sample 104) in response to a determination that a temperature of at least a portion of the sample 104 reached the second temperature. In some examples, the sample 104 is heated (e.g., in-situ heating using the sample stage 124) during the second SEM process. In some examples, at least a portion of the sample 104 has the second temperature during a section of the second SEM process. In some examples, at least a portion of the sample 104 has the second temperature during an entirety of the second SEM process.

In some examples, the second electron beam 134 may be generated based upon one or more second SEM parameters associated with the second SEM process. The one or more second SEM parameters may be controlled based upon one or more characteristics of the sample 104. In an example, the one or more characteristics may comprise a conductivity of the sample 104. The one or more second SEM parameters may be indicative of a second beam current (e.g., a primary beam current) of the second electron beam 134, a duration of the second SEM process, a second acceleration voltage of the second SEM process and/or a second extraction current of the second SEM process. In some examples, the second beam current may be in the range of at least 1 picoampere to at most 50 nanoamperes and/or in the range of at least 1 picoampere to at most 200 picoamperes. In some examples, the second acceleration voltage may be in the range of at least 100 volts to at most 5 kilovolts. In some examples, the second extraction current may be in the range of at least 2 microamperes to at most 10 microamperes. The one or more second SEM parameters may be determined using one or more of the techniques provided herein with respect to determining the one or more first SEM parameters.

In some examples, a second bias (e.g., a second sample bias) is applied to the sample 104 during the second SEM process. For example, the second bias may be applied to the sample 104 during a section of the second SEM process and/or during the entirety of the second SEM process. In some examples, the second bias is a DC bias (e.g., a DC voltage may be applied to the sample 104). Alternatively and/or additionally, the second bias may be a RF bias. In some examples, the second bias may be in the range of at least 1 volt to at most 50 volts (and/or in the range of at least −50 volts to at most −1 volt). The second bias may be different than the first bias. In some examples, a difference between the first bias and the second bias may be in the range of at least 0.1 volts to at most 30 volts. In some examples, the second bias is applied to the sample 104 via the voltage source associated with the first scanning electron microscope, such as using one or more of the techniques provided herein with respect to applying the first bias to the sample 104 during the first SEM process. In some examples, the second bias may correspond to a difference between an output voltage of the voltage source and a voltage of the heat shield of the sample stage 124 (e.g., the HVHS). Embodiments are contemplated in which the second bias is equal to the first bias.

In some examples, the sample 104 and/or the first sample stage 124 are disposed in the chamber (e.g., the vacuum chamber) of the first scanning electron microscope during the second SEM process. The first scanning electron microscope may be configured to establish, maintain and/or preserve a vacuum in the chamber (e.g., the vacuum sealed space) during the second SEM process.

In some examples, the electron detector 118 of the first scanning electron microscope is used to detect second electrons 132 emitted from the sample 104 during the second SEM process. The second electrons 132 may be emitted (e.g., ejected) from the sample 104 via interactions of electrons of the second electron beam 134 with the sample 104. A fourth measure of electrons may be determined based upon the second electrons 132 detected using the electron detector 118. In an example, the second electrons 132 may comprise secondary electrons ejected from the valence band of the sample 104 (e.g., the secondary electrons may be ejected from the sample 104 via inelastic scattering interactions with electrons of the second electron beam 134). In some examples, the second electrons 132 detected using the electron detector 118 include only the secondary electrons (and/or the second electrons 132 do not include one or more other types of electrons emitted from the sample 104, such as backscattered electrons). For example, the fourth measure of electrons may correspond to a measure of secondary electrons emitted from the sample 104 (during the second SEM process, for example). Embodiments are contemplated in which the second electrons 132 include one or more other types of electrons emitted from the sample 104 other than the secondary electrons, such as backscattered electrons (e.g., the second electrons 132 detected using the electron detector 118 may include the secondary electrons and the backscattered electrons).

In some examples, the fourth measure of electrons is associated with the first region of the sample 104. In some examples, the second electrons 132 may be emitted from the first region of the sample 104. The fourth measure of electrons may be determined using one or more of the techniques provided herein with respect to determining the first measure of electrons. In an example, the fourth measure of electrons may correspond to an intensity of the second electrons 132 emitted from the first region (e.g., an intensity of secondary electrons emitted from the first region).

In some examples, the second scanning electron microcopy map 130 is indicative of a second plurality of measures of electrons associated with the first plurality of regions of the sample 104. For example, the second plurality of measures of electrons of electrons may comprise the fourth measure of electrons associated with the first region of the sample 104, a fifth measure of electrons associated with the second region of the sample 104, a sixth measure of electrons associated with the third region of the sample 104, etc. In an example, the second scanning electron microcopy map 130 may correspond to a distribution map of an intensity of a signal (e.g., secondary electrons) being emitted from scanned regions of the first plurality of regions during the second SEM process. In some examples, the second scanning electron microcopy map 130 comprises a second image visually representative of the second plurality of measures of electrons of electrons associated with the first plurality of regions. In some examples, the second scanning electron microcopy map 130 (e.g., the second image) may be generated using one or more of the techniques provided herein with respect to the first scanning electron microcopy map 120 (e.g., the first image).

At 1005 (illustrated in FIG. 1D), sample information 142 associated with the sample 104 may be determined based upon the first scanning electron microcopy map 120 and the second scanning electron microcopy map 130. For example, a sample information determination module 140 may receive the first scanning electron microcopy map 120 and the second scanning electron microcopy map 130 as input, and generate the sample information 142 based upon the first scanning electron microcopy map 120 and the second scanning electron microcopy map 130.

In some examples, the sample information 142 is indicative of one or more dopant concentrations in one or more regions of the sample 104. For example, the sample information 142 may comprise a dopant distribution map indicative of a distribution of dopant concentrations across the first plurality of regions of the sample 104. For example, the dopant distribution map may be indicative of a plurality of dopant concentrations associated with the first plurality of regions. The plurality of dopant concentrations may comprise a first dopant concentration in the first region of the sample 104, a second dopant concentration in the second region of the sample 104, a third dopant concentration in the third region of the sample 104, etc. In some examples, a dopant concentration (of the plurality of dopant concentrations) in a region of the sample 104 may be determined based upon a measure of electrons determined in the first SEM process (associated with the first temperature and/or the first bias) and a measure of electrons determined in the second SEM process (associated with the second temperature and/or the second bias). For example, the first dopant concentration in the first region may be determined based upon the first measure of electrons (determined in the first SEM process) associated with the first region and the fourth measure of electrons (determined in the second SEM process) associated with the first region. Alternatively and/or additionally, the second dopant concentration in the second region may be determined based upon the second measure of electrons associated with the second region and the fifth measure of electrons associated with the second region. Alternatively and/or additionally, the third dopant concentration in the third region may be determined based upon the third measure of electrons associated with the third region and the sixth measure of electrons associated with the third region.

In an example, the first dopant concentration may correspond to a measure of dopants (e.g., activated and/or ionized dopants) in the first region of the sample 104 per unit of area and/or volume. In some examples, the first dopant concentration is indicative of a measure of p-type dopants (e.g., aluminum dopants, boron dopants, gallium dopants, beryllium dopants and/or other p-type dopants) in the first region. Alternatively and/or additionally, the first dopant concentration is indicative of a measure of n-type dopants (e.g., nitrogen dopants, phosphorus dopants and/or other n-type dopants) in the first region. Alternatively and/or additionally, the first dopant concentration is indicative of a measure of p-type dopants and n-type dopants in the first region.

In some examples, a combined metric is determined based upon the first measure of electrons and the fourth measure of electrons. The first dopant concentration (associated with the first region of the sample 104) may be determined based upon the combined metric.

FIG. 2A illustrates a schematic band diagram 200 showing example relationships between various energy levels. Energy levels associated with p-type dopants (and/or p-doped regions of the sample 104) are labeled "E1" (e.g., $E1_{vac}$, $\Delta E1_{effective}$, $\Delta E1_v$, $E1_c$, and/or $E1_v$). Energy levels associated with n-type dopants (and/or n-doped regions of the sample 104) are labeled "E2" (e.g., $E2_{vac}$, $\Delta E2_{effective}$, $\Delta E2_v$, $E2_c$, and/or $E2_v$).

In some examples, $E_{detect}$ corresponds to a detection energy level associated with detection of electrons using the electron detector 118. In some examples, a secondary electron (emitted from the sample 104) that has an energy level meeting (e.g., exceeding) the detection energy level $E_{detect}$ may be detected (and/or detectable) by the electron detector 118. In some examples, a secondary electron, emitted from the sample 104, that has an energy level lower than the detection energy level $E_{detect}$ may not be detected (and/or may not be detectable) by the electron detector 118 (e.g., a secondary electron must have enough energy to meet, such as exceed, the detection energy level $E_{detect}$ in order to be detected by the electron detector 118).

In some examples, $E1_c$ corresponds to a first semiconductor conduction band edge associated with p-type dopants (and/or associated with p-doped regions of the sample 104) and/or $E2_c$ corresponds to a second semiconductor conduction band edge associated with n-type dopants (and/or associated with n-doped regions of the sample 104).

In some examples, $E1_{vac}$ corresponds to a first vacuum energy level associated with p-type dopants (and/or associated with p-doped regions of the sample 104) and/or $E2_{vac}$ corresponds to a second vacuum energy level associated with n-type dopants (and/or associated with n-doped regions of the sample 104). In some examples, the first vacuum energy level $E1_{vac}$ and/or the second vacuum energy level $E2_{vac}$ may be based upon a vacuum (e.g., the first vacuum energy level $E1_{vac}$ and/or the second vacuum energy level $E2_{vac}$ may be based upon an atmospheric pressure in the vacuum) implemented in the chamber of the first scanning electron microscope during a SEM process (e.g., the first SEM process and/or the second SEM process). In some examples, an electron (e.g., a secondary electron originating from the valence band) having an energy level meeting (e.g., exceeding) the first vacuum energy level $E1_{vac}$ may be ejected from a p-doped region of the sample 104. In some examples, an electron (e.g., a secondary electron originating from the valence band) having an energy level that does not meet (e.g., does not exceed) the first vacuum energy level $E1_{vac}$ may not have sufficient energy to be ejected from a p-doped region of the sample 104. In some examples, an electron (e.g., a secondary electron originating from the valence band) having an energy level meeting (e.g., exceeding) the second vacuum energy level $E2_{vac}$ may be ejected from an n-doped region of the sample 104. In some examples, an electron (e.g., a secondary electron originating from the valence band) having an energy level that does not meet (e.g., does not exceed) the second vacuum energy level $E2_{vac}$ may not have sufficient energy to be ejected from an n-doped region of the sample 104.

In an example, in order for an electron (e.g., a secondary electron) originating from the valence band of the sample 104 to be detected during a SEM process (e.g., the first SEM process and/or the second SEM process), the electron may need sufficient energy to be ejected from the sample 104 (e.g., an energy level of the electron meeting, such as exceeding, the vacuum energy level may allow the electron to be ejected from the sample 104) and/or to be detected by the electron detector 118 (e.g., the energy level of the electron meeting, such as exceeding, the detection energy level $E_{detect}$ may allow the electron to be detected using the electron detector 118).

In some examples, $E1_v$ corresponds to a first valence band energy level associated with p-type dopants (and/or associated with p-doped regions of the sample 104) and/or $E2_v$ corresponds to a second valence band energy level associated with n-type dopants (and/or associated with n-doped regions of the sample 104). In some examples, the first valence band energy level $E1_v$ corresponds to a valence band edge associated with p-type dopants (and/or p-doped regions of the sample 104) and/or the second valence band energy level $E2_v$ corresponds to a valence band edge associated with n-type dopants (and/or n-doped regions of the sample 104).

In some examples, $\Delta E1_{effective}$ corresponds to a first effective ionization energy associated with p-type dopants (and/or associated with p-doped regions of the sample 104) and/or $\Delta E2_{effective}$ corresponds to a second effective ionization energy associated with n-type dopants (and/or associated with n-doped regions of the sample 104). The first effective ionization energy $\Delta E1_{effective}$ may correspond to a difference (e.g., an energetic difference) between the first valence band energy level $E1_v$ and the detection energy level $E_{detect}$. The second effective ionization energy $\Delta E2_{effective}$ may correspond to a difference (e.g., an energetic difference) between the second valence band energy level $E2_v$ and the detection energy level $E_{detect}$. The first effective ionization energy $\Delta E1_{effective}$ may be different than the second effective ionization energy $\Delta E2_{effective}$.

In some examples, $E_f$ corresponds to a Fermi level associated with the sample 104. A difference between the first valence band energy level $E1_v$ and the Fermi level $E_f$ may be smaller than a difference between the second valence band energy level $E2_v$ and the Fermi level $E_f$.

In some examples, $\Delta E1_v$ corresponds to a first energy difference associated with p-type dopants (and/or associated with p-doped regions of the sample 104) and/or $\Delta E2_v$ corresponds to a second energy difference associated with n-type dopants (and/or associated with n-doped regions of the sample 104). The first energy difference $\Delta E1_v$ may correspond to a difference (e.g., an energetic difference) between the first valence band energy level $E1_v$ and the Fermi level $E_f$. The second energy difference $\Delta E2_v$ may correspond to a difference (e.g., an energetic difference) between the second valence band energy level $E2_v$ and the Fermi level $E_f$. The first energy difference $\Delta E1_v$ may be different than the second energy difference $\Delta E2_v$.

In some examples, an exact value of the detection energy level $E_{detect}$ may be difficult (and/or impossible) to determine (due to various factors that influence the detection energy level $E_{detect}$, such as at least one of working distance, detector type of the electron detector 118, etc., and thus, it may be difficult (and/or impossible) to determine an exact value of the first effective ionization energy $\Delta E1_{effective}$ and/or an exact value of the second effective ionization energy $\Delta E2_{effective}$. However, the first effective ionization energy $\Delta E1_{effective}$ may be reduced to the first energy difference $\Delta E1_v$ and/or the second effective ionization energy $\Delta E2_{effective}$ may be reduced to the second energy difference $\Delta E2_v$ based upon a difference (e.g., potential difference) between the Fermi level $E_f$ and the detection energy level $E_{detect}$ being constant across at least some regions of the sample 104 (e.g., the difference between the Fermi level $E_f$ and the detection energy level $E_{detect}$ is the same for both a p-doped region and an n-doped region of the sample 104).

In an example, the first effective ionization energy $\Delta E1_{effective}$ may correspond to Equation (1).

$$\Delta E1_{effective} = E_{detect} - E1_V = E_{detect} - E_f + E_f - E1_V = const. + \Delta E1_V \quad (1)$$

In some examples, based upon the difference (e.g., potential difference) between the Fermi level $E_f$ and the detection energy level $E_{detect}$ (e.g., $E_{detect} - E_f$) being constant across at least some regions (e.g., p-doped regions and n-doped regions) of the sample 104, the difference (e.g., $E_{detect} - E_f$) may be subtracted (and/or removed from Equation (1)) to provide the first energy difference $\Delta E1_v$ defined by Equation (2).

$$\Delta E1_V = E_f - E1_V \quad (2)$$

Alternatively and/or additionally, the second energy difference $\Delta E2_v$ may be defined by Equation (3).

$$\Delta E2_V = E_f - E2_V \quad (3)$$

In some examples, the Fermi level $E_f$ may be determined and used to determine the first energy difference $\Delta E1_v$ and/or the second energy difference $\Delta E2_v$. For example, the Fermi level $E_f$ may be determined using Equation (4) (e.g., a charge neutrality equation).

$$n(E_f, T) + N_A^*(E_f, T, N_{A1}) = p(E_f, T) + N_D^+(E_f, T, N_N) \quad (4)$$

In some examples, $n(E_f, T)$ corresponds to a concentration of electrons as a function of the Fermi level $E_f$ and/or a temperature T (e.g., the first temperature, the second temperature, or a different temperature). In some examples, $N_A^*(E_f, T, N_{Al})$ corresponds to a concentration of ionized acceptors as a function of the Fermi level $E_f$, the temperature T and/or an aluminum dopant concentration $N_{Al}$ associated with the sample 104. Embodiments are contemplated in which the concentration of ionized acceptors (e.g., $N_A^*(E_f, T, N_{Al})$) is a function of one or more other p-type dopant concentrations such as at least one of a boron dopant concentration associated with the sample 104, a gallium dopant concentration associated with the sample 104, a beryllium dopant concentration associated with the sample 104, etc., wherein the concentration of ionized acceptors is or is not a function of the aluminum dopant concentration $N_{Al}$. In some examples, $p(E_f, T)$ corresponds to a concentration of holes as a function of the Fermi level $E_f$ and/or a temperature T (e.g., the first temperature, the second temperature, or a different temperature). In some examples, $N_D^*(E_f, T, N_N)$ corresponds to a concentration of ionized donors as a function of the Fermi level $E_f$, the temperature T and/or a nitrogen dopant concentration $N_N$ associated with the sample 104. Embodiments are contemplated in which the concentration of ionized donors (e.g., $N_D^*(E_f, T, N_N)$) is a function of one or more other n-type dopant concentrations such as a phosphorus dopant concentration associated with the sample 104 or other n-type dopant concentration associated with the sample 104, wherein the concentration of ionized donors is or is not a function of the nitrogen dopant concentration $N_N$.

In some examples, when the Fermi level $E_f$ is determined (using Equation (4), for example), the Fermi level $E_f$ may be used to determine the first energy difference $\Delta E1_v$ (associated with p-type dopants and/or p-doped regions, for example) according to equation (2) and/or determine the second energy difference $\Delta E2_v$ (associated with n-type dopants and/or n-doped regions, for example) according to Equation (3).

Figure 2B:
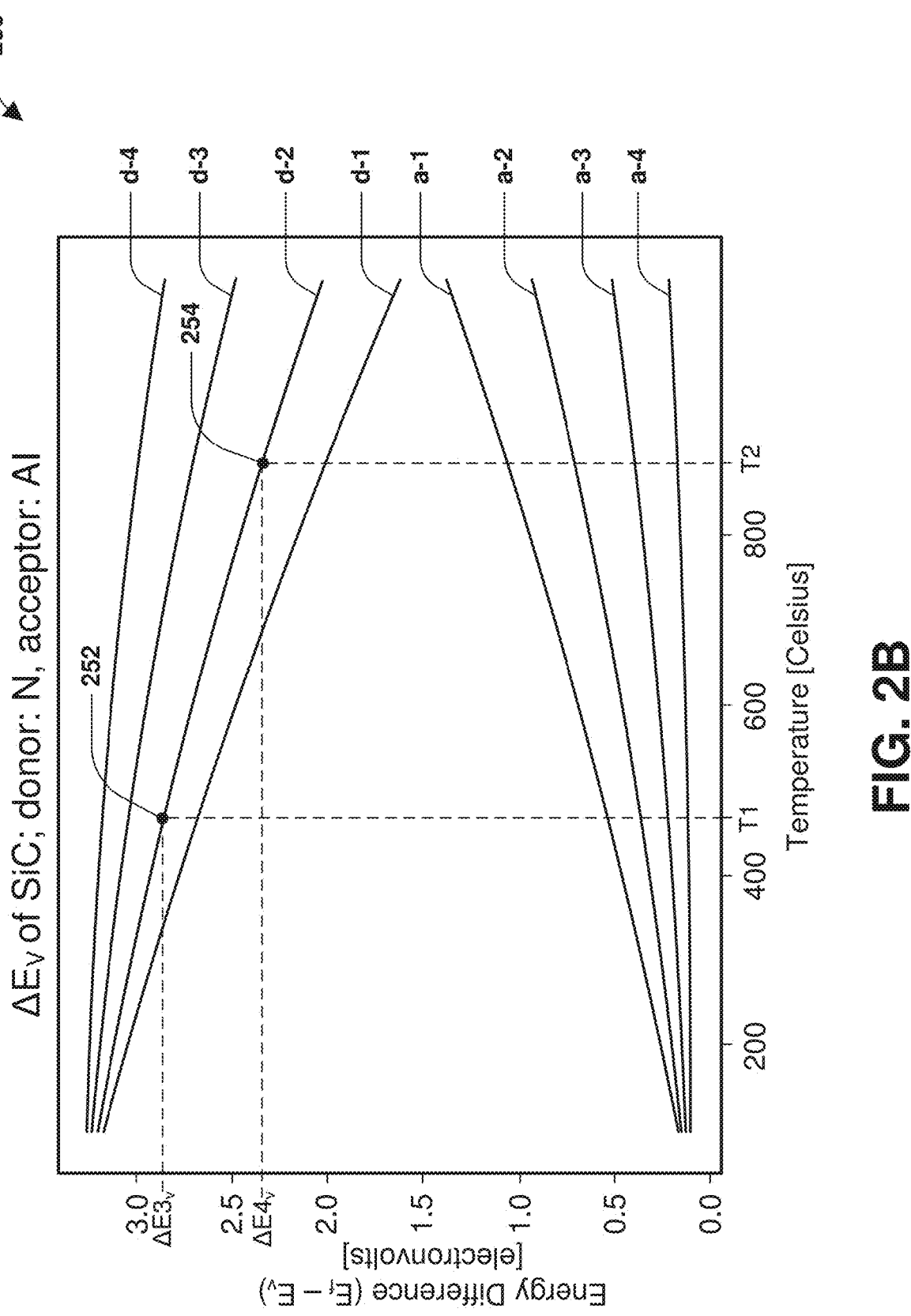
FIG. 2B is a data set representative of example energy difference curves associated with various dopant concentrations and/or dopant types.

In some examples, an energy difference (e.g., the first energy difference $\Delta E1_v$ and/or the second energy difference $\Delta E2_v$) associated with a region of a sample (e.g., at least a portion of a semiconductor wafer) may be dependent upon a temperature (e.g., the first temperature and/or the second temperature) of the sample during a SEM process performed on the sample. FIG. 2B illustrates a data set 250 representative of example energy difference curves associated with various dopant concentrations and/or dopant types. Curves d-1, d-2, d-3 and d-4 are associated with donors (e.g., n-type dopants) and/or n-doped regions. Curves a-1, a-2, a-3 and a-4 are associated with acceptors (e.g., p-type dopants) and/or p-doped regions.

An energy difference curve in the data set 250 may correspond to energy difference values of a region of a sample (e.g., at least a portion of a semiconductor wafer) as a function of temperature of the sample during a SEM process performed on the sample. Each curve in the data set 250 may correspond to a dopant concentration and/or a conductivity type of the region.

In an example, (i) curve d-1 may correspond to a first n-type dopant concentration (e.g., in the range of at least $1\times10^{\wedge}14$ centimeters$^{-2}$ (cm$^{-2}$) to at most $9.99\times10^{\wedge}14$ cm$^{-2}$), (ii) curve d-2 may correspond to a second n-type dopant concentration (e.g., in the range of at least $1\times10^{\wedge}16$ cm$^{-2}$ to at most $9.99\times10^{\wedge}16$ cm$^{-2}$), (iii) curve d-3 may correspond to a third n-type dopant concentration (e.g., in the range of at least $1\times10^{\wedge}18$ cm$^{-2}$ to at most $9.99\times10^{\wedge}18$ cm$^{-2}$), (iv) curve d-4 may correspond to a fourth n-type dopant concentration (e.g., in the range of at least $1\times10^{\wedge}20$ cm$^{-2}$ to at most $9.99\times10^{\wedge}20$ cm$^{-2}$), (v) curve a-1 may correspond to a first p-type dopant concentration (e.g., in the range of at least $1\times10^{\wedge}14$ cm$^{-2}$ to at most $9.99\times10^{\wedge}14$ cm$^{-2}$), (vi) curve a-2 may correspond to a second p-type dopant concentration (e.g., in the range of at least $1\times10^{\wedge}16$ cm$^{-2}$ to at most $9.99\times10^{\wedge}16$ cm$^{-2}$), (vii) curve a-3 may correspond to a third p-type dopant concentration (e.g., in the range of at least $1\times10^{\wedge}18$ cm$^{-2}$ to at most $9.99\times10^{\wedge}18$ cm$^{-2}$), and/or (viii) curve a-4 may correspond to a fourth p-type dopant concentration (e.g., in the range of at least $1\times10^{\wedge}20$ cm$^{-2}$ to at most $9.99\times10^{\wedge}20$ cm$^{-2}$).

In some examples, the first dopant concentration in the first region of the sample 104 may be determined based upon first information associated with a plurality of SEM processes performed on the sample 104. The plurality of SEM processes may comprise the first SEM process performed with the first temperature, the second SEM process performed with the second temperature, and/or one or more other SEM processes performed with one or more other temperatures. The first information may include (i) temperatures associated with the plurality of SEM processes, and/or (ii) energy differences associated with the plurality of SEM processes. For example, the first information used to determine the first dopant concentration in the first region may include (i) the first temperature (shown as "T1" in FIG. 2B) associated with the first SEM process, (ii) a third energy difference $\Delta E3_v$ determined based upon one or more measures of electrons (and/or the first scanning electron microcopy map 120) determined via the first SEM process, (iii) the second temperature (shown as "T2" in FIG. 2B) associated with the second SEM process, (iv) a fourth energy difference $\Delta E4_v$ determined based upon one or more measures of electrons (and/or the second scanning electron microcopy map 130) determined via the second SEM process, and/or (v) one or more other energy differences and/or temperatures associated with one or more other SEM processes performed on the sample 104.

In some examples, the third energy difference $\Delta E3_v$ may be determined based upon the first measure of electrons determined via the first SEM process associated with the first temperature T1. For example, a first Fermi level associated with the first region and/or a third valence band energy level associated with the first region may be determined based on the first measure of electrons. The first Fermi level and/or the third valence band energy level may be determined using one or more of the techniques (e.g., application of equations (1), (2), (3) and/or (4)) provided herein with respect to determining the Fermi level $E_f$, the first valence band energy level $E1_v$ and/or the second valence band energy level $E2_v$. The third energy difference $\Delta E3_v$ may correspond to a difference between the first Fermi level and the third valence band energy level.

In some examples, the fourth energy difference $\Delta E4_v$ may be determined based upon the fourth measure of electrons (associated with the first region) determined via the second SEM process associated with the second temperature T2. For example, a second Fermi level associated with the first region and/or a fourth valence band energy level associated with the first region may be determined based on the fourth measure of electrons. The second Fermi level and/or the fourth valence band energy level may be determined using one or more of the techniques (e.g., application of equations (1), (2), (3) and/or (4)) provided herein with respect to determining the Fermi level $E_f$, the first valence band energy level $E1_v$ and/or the second valence band energy level $E2_v$.

The fourth energy difference $\Delta E4_v$ may correspond to a difference between the second Fermi level and the fourth valence band energy level.

In an example shown in FIG. 2B, the first dopant concentration in the first region of the sample 104 may be determined based upon the first temperature T1, the second temperature T2, the third energy difference $\Delta E3_v$ and/or the fourth energy difference $\Delta E4_v$, examples of which are shown in FIG. 2B. In some examples, a first point 252 may correspond to the first temperature T1 and/or the third energy difference $\Delta E3_v$. A second point 254 may correspond to the second temperature T2 and/or the fourth energy difference $\Delta E4_v$. In some examples, an energy difference profile may be used to determine the first dopant concentration. The energy difference profile may be indicative of a plurality of relationships (e.g., the energy difference curves in FIG. 2B) associated with different dopant concentrations. A relationship of the plurality of relationships corresponds to a relationship (e.g., a function, a data set, etc.) between temperature and energy difference for a dopant concentration. For example, a first relationship of the plurality of relationships corresponds to a first relationship between temperature and energy difference for a first dopant concentration value, a second relationship of the plurality of relationships corresponds to a second relationship between temperature and energy difference for a second dopant concentration value, etc. In some examples, based upon a determination that the first information (e.g., the first temperature T1, the second temperature T2, the third energy difference $\Delta E3_v$ and/or the fourth energy difference $\Delta E4_v$) matches the first relationship indicated by the energy difference profile, the first dopant concentration may be determined to be the first dopant concentration value associated with the (matching) first relationship. In some examples, the energy difference profile may be determined based upon one or more characteristics (e.g., one or more materials, one or more properties, etc.) of the sample 104, the one or more first SEM parameters, the one or more second SEM parameters, the first bias, the second bias, and/or other information. In some examples, the energy difference profile may be determined using Equation (4) (e.g., the charge neutrality equation).

In an example, the plurality of relationships may be represented by energy difference curves in FIG. 2B (e.g., the first relationship may be represented by curve d-1, the second relationship may be represented by curve d-2, etc.). For example, the first point 252 and/or the second point 254 may be compared with energy difference curves to determine a matching curve (e.g., a curve that matches the first point 252 and/or the second point 254). For example, it may be determined that the first point 252 and/or the second point 254 matches curve d-2 (e.g., the first point 252 may be determined to match curve d-2 based upon the first point 252 lying on curve d-2 or being within a threshold distance of curve d-2 and/or the second point 254 may be determined to match curve d-2 based upon the second point 254 lying on curve d-2 or being within the threshold distance of curve d-2). The first region of the sample 104 may be determined to have the second n-type dopant concentration associated with curve d-2 based upon the first point 252 and/or the second point 254 matching curve d-2 (e.g., the first dopant concentration may correspond to the second n-type dopant concentration associated with curve d-2). It may be appreciated that more than two points (e.g., one or more points in addition to the first point 252 and the second point 254) may be used to determine the first dopant concentration in the first region. For example, one or more other SEM processes (in addition to the first SEM process and/or the second SEM process, for example) may be performed with one or more other temperatures (in addition to the first temperature and/or the second temperature, for example) to determine one or more other points (in addition to the first point 252 and/or the second point 254, for example) for use in determining the first dopant concentration associated with the first region.

In some examples, a first slope may be determined based upon points (e.g., the first point 252, the second point 254 and/or one or more other points) associated with energy differences and/or temperatures of the plurality of SEM processes performed on the sample 104. Accordingly, the first slope may correspond to a rate of change of energy difference (e.g., difference between a Fermi level and a valence band energy level) associated with the first region of the sample 104 as a function of temperature, for example. In some examples, the first dopant concentration may be determined based upon the first slope. For example, the first slope may be compared with a plurality of slopes associated with various (known) dopant concentrations. Alternatively and/or additionally, a relationship (defined by an equation and/or one or more values, for example) between the first slope and the first dopant concentration may be known. For example, one or more operations (e.g., one or more mathematical operations of an executed algorithm) may be performed using the first slope and/or one or more parameters (e.g., at least one of a parameter of the first scanning electron microscope, a parameter of the plurality of SEM processes, a parameter of the sample 104, etc.) to determine the first dopant concentration.

In some examples, other dopant concentrations (other than the first dopant concentration) of the plurality of dopant concentrations may be determined using one or more of the techniques provided herein with respect to determining the first dopant concentration associated with the first region.

Alternatively and/or additionally, the first dopant concentration may be used (as a reference, for example) to determine a first conversion function (e.g., a linear function and/or other type of function) for converting a measure of electrons determined via a SEM process to a dopant concentration. In an example, the first conversion function may be determined based upon the first dopant concentration associated with the first region and a measure of electrons (e.g., at least one of the first measure of electrons, the fourth measure of electrons, etc.) associated with the first region. In an example, based upon the first measure of electrons (determined in the first SEM process) corresponding to 2.5 electronvolts and the first dopant concentration corresponding to $5 \times 10^{16}$ cm$^{-2}$, a value C of the first conversion function may be determined according to 2.5 electronvolts$\times$C$=5 \times 10^{16}$ cm$^{-2}$. For example, the value C may be determined to be $$C = \frac{5 \times 10^{16}}{2.5} \frac{\text{cm}^{-2}}{\text{electronvolts}} = 2 \times 10^{16} \frac{\text{cm}^{-2}}{\text{electronvolts}}.$$

In some examples, the first conversion function may comprise determining a dopant concentration associated with a region i of the sample 104 to be $2 \times 10^{16} \times m_i$, wherein $m_i$ corresponds to a measure of electrons, of the first plurality of measures of electrons determined in the first SEM process, associated with the region i of the sample 104. In some examples, one or more dopant concentrations (e.g., one some and/or all dopant concentrations, of the plurality of dopant concentrations, other than the first dopant concentration) may be determined based upon the first conversion function and one or more measures of electrons determined via a SEM process (e.g., the first SEM process). In an example, the first conversion function may be applied to the second measure of electrons to determine the second dopant concentration associated with the second region (e.g., the second dopant concentration may be determined to be $2 \times 10^{\wedge}16 \times m_2$, wherein $m_2$ corresponds to the second measure of electrons). Alternatively and/or additionally, the first conversion function may be applied to the third measure of electrons to determine the third dopant concentration associated with the third region (e.g., the third dopant concentration may be determined to be $2 \times 10^{\wedge}16 \times m_3$, wherein $m_3$ corresponds to the third measure of electrons).

In some examples, multiple conversion functions may be determined and/or used to determine dopant concentrations of the plurality of dopant concentrations. In an example, the multiple conversion functions may be associated with different conductivity types. In an example, the first conversion function may be associated with n-doped regions and a second conversion function may be associated with p-doped regions. In some examples, the first conversion function may be applied to a measure of electrons associated with an n-doped region to determine a dopant concentration (e.g., an n-type dopant concentration) associated with the n-doped region. In some examples, the second conversion function may be applied to a measure of electrons associated with a p-doped region to determine a dopant concentration (e.g., a p-type dopant concentration) associated with the p-doped region.

In some examples, the first dopant concentration corresponds to an n-type dopant concentration (e.g., the second n-type dopant concentration associated with curve d-2) in the first region. For example, the first region may be an n-doped region (e.g., at least a threshold proportion, such as 50%, of dopants in the first region are n-type dopants) and/or the first dopant concentration may correspond to a concentration of n-type dopants in the first region. In an example in which the second region is an n-doped region (e.g., at least a threshold proportion, such as 50%, of dopants in the second region are n-type dopants), the first conversion function may be applied to the second measure of electrons to determine the second dopant concentration (e.g., an n-type dopant concentration) associated with the second region (e.g., the second dopant concentration may correspond to a concentration of n-type dopants in the second region).

In some examples, a fourth dopant concentration of the plurality of dopant concentrations corresponds to a p-type dopant concentration in a fourth region (of the sample 104) of the plurality of regions. The fourth dopant concentration (and/or one or more other p-type dopant concentrations, for example) may be used (as a reference, for example) to determine the second conversion function (using one or more of the techniques provided herein with respect to determining the first conversion function based upon the first dopant concentration, for example). In an example in which the third region is a p-doped region (e.g., at least a threshold proportion, such as 50%, of dopants in the third region are p-type dopants), the second conversion function may be applied to the third measure of electrons to determine the third dopant concentration (e.g., a p-type dopant concentration) associated with the third region (e.g., the third dopant concentration may correspond to a concentration of p-type dopants in the third region).

In some examples, whether a region is an n-doped region or a p-doped region may be determined based upon a measure of electrons (determined via a SEM process) associated with the region. In an example, n-doped regions may be associated with a first range of measures of electrons and p-doped regions may be associated with a second range of measures of electrons. In some examples, the first range does not overlap with the second range. In an example, the second region may be determined to be an n-doped region (and thus the first conversion function may be applied to the second measure of electrons to determine the second dopant concentration in the second region, for example) based upon the second measure of electrons being within the first range. Alternatively and/or additionally, the third region may be determined to be a p-doped region (and thus the second conversion function may be applied to the third measure of electrons to determine the third dopant concentration in the third region, for example) based upon the third measure of electrons being within the second range.

In some examples, the first dopant concentration may be used (as a reference, for example) to determine the first conversion function based upon a determination that the first region corresponds to an implantation peak, a plateau (e.g., a plateau of constant dopant concentrations) or other location of the sample 104. Alternatively and/or additionally, the second dopant concentration may be used (as a reference, for example) to determine the second conversion function based upon a determination that the second region corresponds to an implantation peak, a plateau (e.g., a plateau of constant dopant concentrations) or other location of the sample 104. Embodiments are contemplated in which the first conversion function may be associated with n-doped regions and/or the second conversion function may be associated with p-doped regions.

In some examples, the sample information 142 is indicative of one or more measures of electric field strength relative to one or more regions of the sample 104. For example, the sample information 142 may comprise an electric field strength map indicative of a distribution of measures of electric field strength across the first plurality of regions of the sample 104. For example, the electric field strength map may be indicative of a plurality of measures of electric field strength associated with the first plurality of regions. The plurality of measures of electric field strength may comprise a first measure of electric field strength in the first region of the sample 104, a second measure of electric field strength in the second region of the sample 104, a third measure of electric field strength in the third region of the sample 104, etc. In some examples, a measure of electric field strength (of the plurality of measures of electric field strength) relative to a region of the sample 104 may be determined based upon a measure of electrons determined in the first SEM process (associated with the first temperature and/or the first bias) and a measure of electrons determined in the second SEM process (associated with the second temperature and/or the second bias). For example, the first measure of electric field strength in the first region may be determined based upon the first measure of electrons (determined in the first SEM process) associated with the first region and the fourth measure of electrons (determined in the second SEM process) associated with the first region. Alternatively and/or additionally, the second measure of electric field strength in the second region may be determined based upon the second measure of electrons associated with the second region and the fifth measure of electrons associated with the second region. Alternatively and/or additionally, the third measure of electric field strength in the third region may be determined based upon the third measure of electrons associated with the third region and the sixth measure of electrons associated with the third region.

A measure of electric field strength (e.g., the first measure of electric field strength, the second measure of electric field strength, the third measure of electric field strength, etc.) may be determined using one or more of the techniques provided herein with respect to determining a dopant concentration (e.g., the first dopant concentration, the second dopant concentration, the third dopant concentration, etc.). In some examples, the first measure of electric field strength may be determined based upon the first information associated with the plurality of SEM processes performed on the sample 104. For example, the first measure of electric field strength may be determined based upon the first temperature T1 associated with the first SEM process, the third energy difference $\Delta E3_v$, the second temperature T2, the fourth energy difference $\Delta E4_v$, and/or one or more other energy differences and/or temperatures. In an example, the first measure of electric field strength may be determined based upon a determination that points (e.g., the first point 252, the second point 254 and/or one or more other points) associated with energy differences and/or temperatures of the plurality of SEM processes match a curve corresponding to the first measure of electric field strength. In some examples, the first measure of electric field strength may be determined based upon the first slope (e.g., a rate of change of energy difference associated with the first region of the sample 104 as a function of temperature), such as using one or more of techniques provided herein with respect to determining the first dopant concentration based upon the first slope. In some examples, the first measure of electric field strength may be used (as a reference, for example) to determine a conversion function (e.g., a linear function and/or other type of function) for converting a measure of electrons determined via a SEM process to a measure of electric field strength. In an example, the conversion function may be determined using one or more of the techniques provided herein with respect to determining the first conversion function. In some examples, one or more measures of electric field strength (e.g., one some and/or all measures of electric field strength, of the plurality of measures of electric field strength, other than the first measure of electric field strength) may be determined based upon the conversion function and one or more measures of electrons determined via a SEM process (e.g., the first SEM process). In an example, the first conversion function may be applied to the second measure of electrons to determine the second measure of electric field strength associated with the second region.

In some examples, the sample information 142 is indicative of one or more defect concentrations in one or more regions of the sample 104. For example, the sample information 142 may comprise a defect distribution map indicative of a distribution of defect concentrations across the first plurality of regions of the sample 104. For example, the defect distribution map may be indicative of a plurality of defect concentrations associated with the first plurality of regions. The plurality of defect concentrations may comprise a first defect concentration in the first region of the sample 104, a second defect concentration in the second region of the sample 104, a third defect concentration in the third region of the sample 104, etc. In some examples, a defect concentration (of the plurality of defect concentrations) in a region of the sample 104 may be determined based upon a measure of electrons determined in the first SEM process (associated with the first temperature and/or the first bias) and a measure of electrons determined in the second SEM process (associated with the second temperature and/or the second bias). For example, the first defect concentration in the first region may be determined based upon the first measure of electrons (determined in the first SEM process) associated with the first region and the fourth measure of electrons (determined in the second SEM process) associated with the first region.

A defect concentration (e.g., the first defect concentration, the second defect concentration, the third defect concentration, etc.) may be determined using one or more of the techniques provided herein with respect to determining a dopant concentration (e.g., the first dopant concentration, the second dopant concentration, the third dopant concentration, etc.). In some examples, the first defect concentration may be determined based upon the first information associated with the plurality of SEM processes performed on the sample 104. For example, the first defect concentration may be determined based upon the first temperature T1 associated with the first SEM process, the third energy difference $\Delta E3_v$, the second temperature T2, the fourth energy difference $\Delta E4_v$, and/or one or more other energy differences and/or temperatures. In an example, the first defect concentration may be determined based upon a determination that points (e.g., the first point 252, the second point 254 and/or one or more other points) associated with energy differences and/or temperatures of the plurality of SEM processes match a curve corresponding to the first defect concentration. In some examples, the first defect concentration may be determined based upon the first slope (e.g., a rate of change of energy difference associated with the first region of the sample 104 as a function of temperature), such as using one or more of techniques provided herein with respect to determining the first dopant concentration based upon the first slope. In some examples, the first defect concentration may be used (as a reference, for example) to determine a conversion function (e.g., a linear function and/or other type of function) for converting a measure of electrons determined via a SEM process to a defect concentration. In an example, the conversion function may be determined using one or more of the techniques provided herein with respect to determining the first conversion function. In some examples, one or more defect concentrations (e.g., one some and/or all defect concentrations, of the plurality of defect concentrations, other than the first defect concentration) may be determined based upon the conversion function and one or more measures of electrons determined via a SEM process (e.g., the first SEM process). In an example, the conversion function may be applied to the second measure of electrons to determine the second defect concentration associated with the second region.

In some examples, the sample information 142 is indicative of one or more Fermi levels in one or more regions of the sample 104. For example, the sample information 142 may comprise a Fermi level distribution map indicative of a distribution of Fermi levels across the first plurality of regions of the sample 104. A Fermi level may be distributed as a map (e.g., the Fermi level distribution map) throughout the sample 104. For example, the Fermi level distribution map may be indicative of a plurality of Fermi levels associated with the first plurality of regions. In some examples, Fermi levels may be different for different regions of the sample 104 (e.g., the plurality of Fermi levels may comprise different Fermi levels for different regions of the plurality of regions). In some examples, a Fermi level (of the plurality of Fermi levels) in a region of the sample 104 may be determined based upon a measure of electrons determined in the first SEM process (associated with the first temperature and/or the first bias) and a measure of electrons determined in the second SEM process (associated with the second temperature and/or the second bias). In some examples, a Fermi level (of the plurality of Fermi levels) in a region of the sample 104 may be determined using one or more of the techniques provided herein with respect to determining the first Fermi level and/or the second Fermi level. In some examples, Fermi levels indicated by the Fermi level distribution map may be used to determine at least some of the sample information 142. For example, dopant concentrations of the plurality of dopant concentrations may be determined based upon Fermi levels indicated by the Fermi level distribution map.

In some examples, the sample information 142 comprises an indication of a space charge region (e.g., the space charge region 702 shown in FIG. 7A). The space charge region may be associated with a p-n junction of the sample 104. The space charge region may be identified (e.g., automatically identified) based upon one or more dopant concentrations (of the plurality of dopant concentrations, for example). In some examples, the indication of the space charge region comprises a graphical object corresponding to a visual representation of the space charge region. Alternatively and/or additionally, the indication of the space charge region comprises one or more metrics associated with the space charge region 702, such as a length 704 of the space charge region 702. In some examples, the one or more metrics may be determined (e.g., automatically determined) based upon one or more dopant concentrations (of the plurality of dopant concentrations, for example).

FIG. 3 is an illustration of an example method 300 for determining a dopant distribution map of a sample. At 302, when a sample (e.g., the sample 104) has a first temperature, a first SEM process is performed on the sample to generate a first SEM map. The first SEM process may be performed and/or the first SEM map may be generated using one or more of the techniques provided herein with respect to act 1003 (illustrated in FIG. 1B). At 304, when the sample has a second temperature different than the first temperature, a second SEM process is performed on the sample to generate a second SEM map. The second SEM process may be performed and/or the second SEM map may be generated using one or more of the techniques provided herein with respect to act 1004 (illustrated in FIG. 1C). At 306, a dopant distribution map is generated based upon the first SEM map and the second SEM map. The dopant distribution map is indicative of a first dopant concentration in a first region of the sample and a second dopant concentration in a second region of the sample. The dopant distribution map may be generated using one or more of the techniques provided herein with respect to generating the dopant distribution map of the sample information 142 determined in act 1005 (illustrated in FIG. 1D).

FIG. 4 is an illustration of an example method 400 for determining sample information of a sample. At 402, when a sample (e.g., the sample 104) has a first temperature, a first measure of electrons of the sample is determined. The first measure of electrons may be determined via a first SEM process performed using one or more of the techniques provided herein with respect to act 1003 (illustrated in FIG. 1B). At 404, when the sample has a second temperature different than the first temperature, a second measure of electrons of the sample is determined. The second measure of electrons may be determined via a second SEM process performed using one or more of the techniques provided herein with respect to act 1004 (illustrated in FIG. 1C). At 406, sample information, associated with the sample, are determined based upon the first measure of electrons and the second measure of electrons. The sample information may be indicative of at least one of a dopant concentration of the sample, a measure of electric field strength of the sample, a defect concentration of the sample, a Fermi level of the sample and/or an indication (e.g., a measure and/or representation) of a space charge region of the sample. The sample information may be determined using one or more of the techniques provided herein with respect to determining the sample information 142 in act 1005 (illustrated in FIG. 1D).

In some examples, sample information associated with a sample may be determined based upon (i) one or more measures of electrons determined via a SEM process performed on the sample and/or (ii) one or more reference metrics (e.g., one or more predefined and/or known metrics) associated with the sample (e.g., at least one of dopant concentration, electric field strength, etc.). For example, the sample information associated with the sample may be determined based upon a SEM map indicative of a plurality of measures of electrons associated with a plurality of regions of the sample.

Figure 1C:
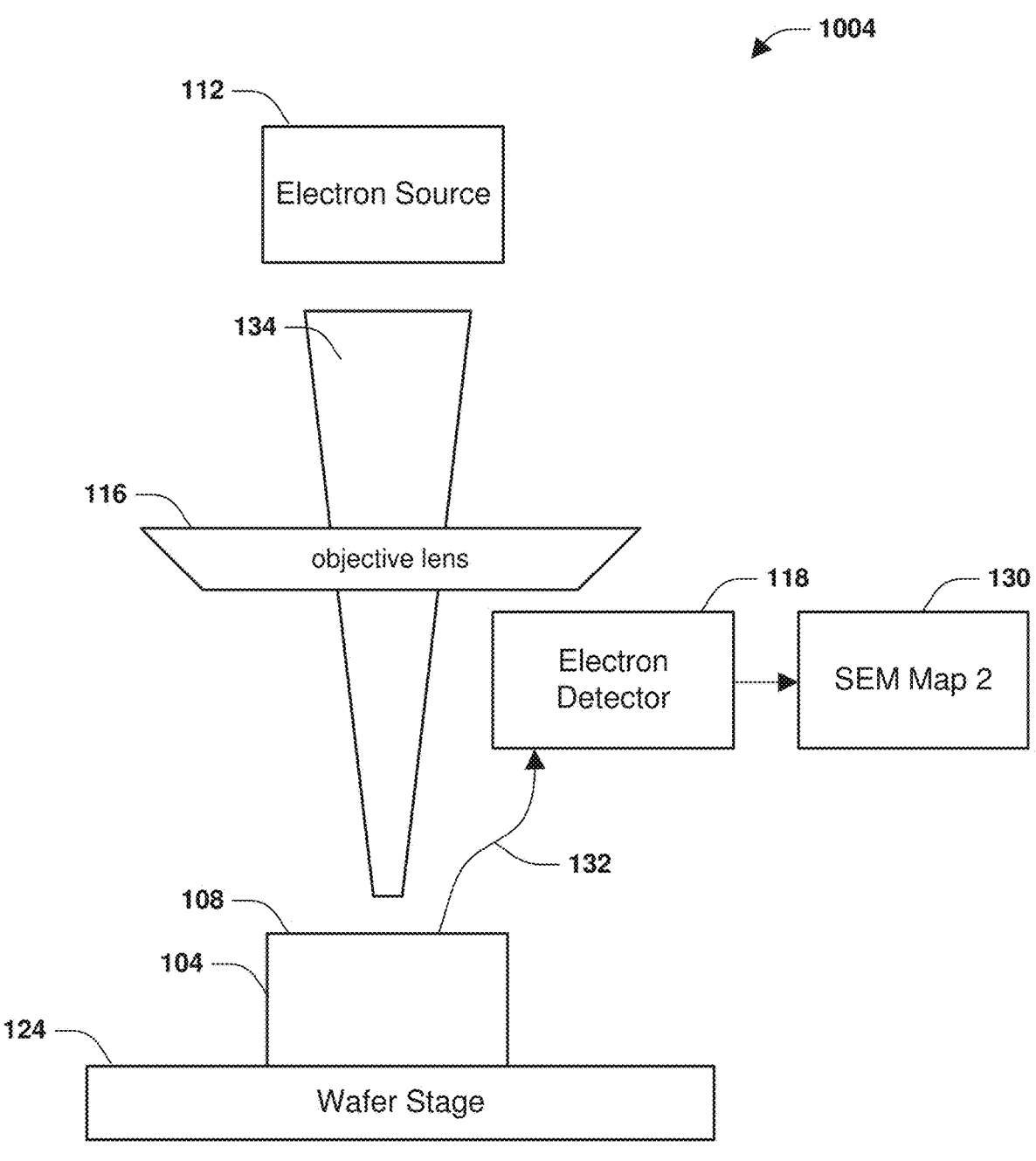
FIG. 1C schematically illustrates an act of determining sample information of a semiconductor device according to various examples.

In some examples, the SEM map may be generated (via the SEM process performed on the sample) using one or more of the techniques provided herein with respect to act 1003 (illustrated in FIG. 1B) and/or act 1004 (illustrated in FIG. 1C). For example, the SEM process may comprise emitting an electron beam (e.g., the first electron beam 114) to the sample. The electron beam may generate electron-hole pairs in the sample. The generated electron-hole pairs may (at least partially) fill surface states associated with the sample and/or may suppress surface band bending associated with the sample, thereby resulting in the sample having a flat-band condition (towards the vacuum in the chamber and/or the first electron beam 114, for example). In some examples, the SEM process may be performed based upon one or more SEM parameters. In some examples, the one or more SEM parameters may be indicative of (i) a beam current (e.g., a primary beam current) of the electron beam (e.g., the beam current may be in the range of at least 1 picoampere to at most 200 picoamperes), (ii) a duration of the SEM process, (iii) an acceleration voltage of the SEM process (e.g., the acceleration voltage may be in the range of at least 100 volts to at most 5 kilovolts and/or in the range of at least 500 volts to at most 1.5 kilovolts) and/or (iv) an extraction current of the first SEM process (e.g., the extraction current may be in the range of at least 2 microamperes to at most 10 microamperes). In some examples, a sample bias (e.g., a stage bias of a sample stage upon which the sample is set, for example) is applied to the sample during the SEM process (e.g., using one or more of the techniques provided herein with respect to applying the first bias to the sample 104 during the first SEM process and/or applying the second bias to the sample 104 during the second SEM process). In some examples, the sample bias may be in the range of at least 1 volt to at most 20 volts. In some examples, an electron detector (e.g., the electron detector 118) is used to detect electrons (e.g., secondary electrons) emitted from the sample during the SEM process to determine a measure of electrons (associated with a region of the plurality of regions of the sample, for example).

In some examples, the one or more reference metrics may comprise one or more reference dopant concentrations of one or more reference regions of the sample. In an example, the one or more reference dopant concentrations comprise a first reference dopant concentration in a first region of the sample and/or a second reference dopant concentration in a second region of the sample. In some examples, the first reference dopant concentration corresponds to a p-type dopant concentration (e.g., a concentration of p-type dopants) of a p-doped region (e.g., at least a threshold proportion, such as 50%, of dopants in the first region of the sample are p-type dopants). In some examples, the second reference dopant concentration corresponds to an n-type dopant concentration (e.g., a concentration of n-type dopants) of an n-doped region (e.g., at least a threshold proportion, such as 50%, of dopants in the second region of the sample are n-type dopants).

In some examples, a fifth energy difference $\Delta E5_v$ associated with the first region (e.g., the p-doped region) and/or a sixth energy difference $\Delta E6_v$ associated with the second region (e.g., the n-doped region) may be determined. In some examples, the fifth energy difference $\Delta E5_v$ and/or the sixth energy difference $\Delta E6_v$ may be determined according to Equations (1), (2), (3), and/or (4). In some examples, the fifth energy difference $\Delta E5_v$ and/or the sixth energy difference $\Delta E6_v$ may be determined using one or more of the techniques provided herein with respect to determining the first energy difference $\Delta E1_v$, the second energy difference $\Delta E2_v$, the third energy difference $\Delta E3_v$ and/or the fourth energy difference $\Delta E4_v$.

In some examples, the fifth energy difference $\Delta E5_v$ and/or the sixth energy difference $\Delta E6_v$ may be determined using quasi Fermi level splitting, which may be defined and/or applied symmetrically, for example. For example, based upon a quasi Fermi level splitting parameter $\Delta E_f$, Equation (4) may be modified to Equation (5) by shifting Fermi levels for electrons and holes (e.g., shifting a Fermi level for electrons by $$+\frac{\Delta E_f}{2}$$

and/or shifting a Fermi level for holes by $$-\frac{\Delta E_f}{2}\Bigg).$$

$$n\left(E_f + \frac{\Delta E_f}{2}, T\right) + N_A^*\left(E_f + \frac{\Delta E_f}{2}, T, N_{A1}\right) = p\left(E_f - \frac{\Delta E_f}{2}, T\right) + \\ N_D^*\left(E_f - \frac{\Delta E_f}{2}, T, N_N\right) \quad (5)$$

In some examples, the quasi Fermi level splitting parameter $\Delta E_f$ may be in the range of at least 0.5 electronvolts to at most 10 electronvolts, and/or in the range of at least 1 electronvolt to at most 2 electronvolts. Equation (5) may be used to determine the fifth energy difference $\Delta E5_v$ and/or the sixth energy difference $\Delta E6_v$.

In some examples, the fifth energy difference $\Delta E5_v$ associated with the first region is mapped to (i) a first measure of electrons, indicated by the SEM map, associated with the first region (e.g., the first measure of electrons may be indicated by a pixel value of a first pixel, in the SEM map, corresponding to the first region), and/or (ii) the first reference dopant concentration (e.g., p-type dopant concentration) associated with the first region (e.g., p-doped region). The sixth energy difference $\Delta E6_v$ associated with the first region is mapped to (i) a second measure of electrons, indicated by the SEM map, associated with the second region (e.g., the second measure of electrons may be indicated by a pixel value of a second pixel, in the SEM map, corresponding to the second region), and/or (ii) the second reference dopant concentration (e.g., n-type dopant concentration) associated with the second region (e.g., n-doped region). In some examples, a conversion function for converting a measure of electrons indicated by the SEM map to a dopant concentration may be determined based upon the fifth energy difference $\Delta E5_v$, the first measure of electrons, the first reference dopant concentration, the sixth energy difference $\Delta E6_v$, the second measure of electrons and/or the second reference dopant concentration. The conversion function may be used to determine dopant concentrations of regions (other than the first region and/or the second region, for example) of the plurality of regions.

Figure 5A:
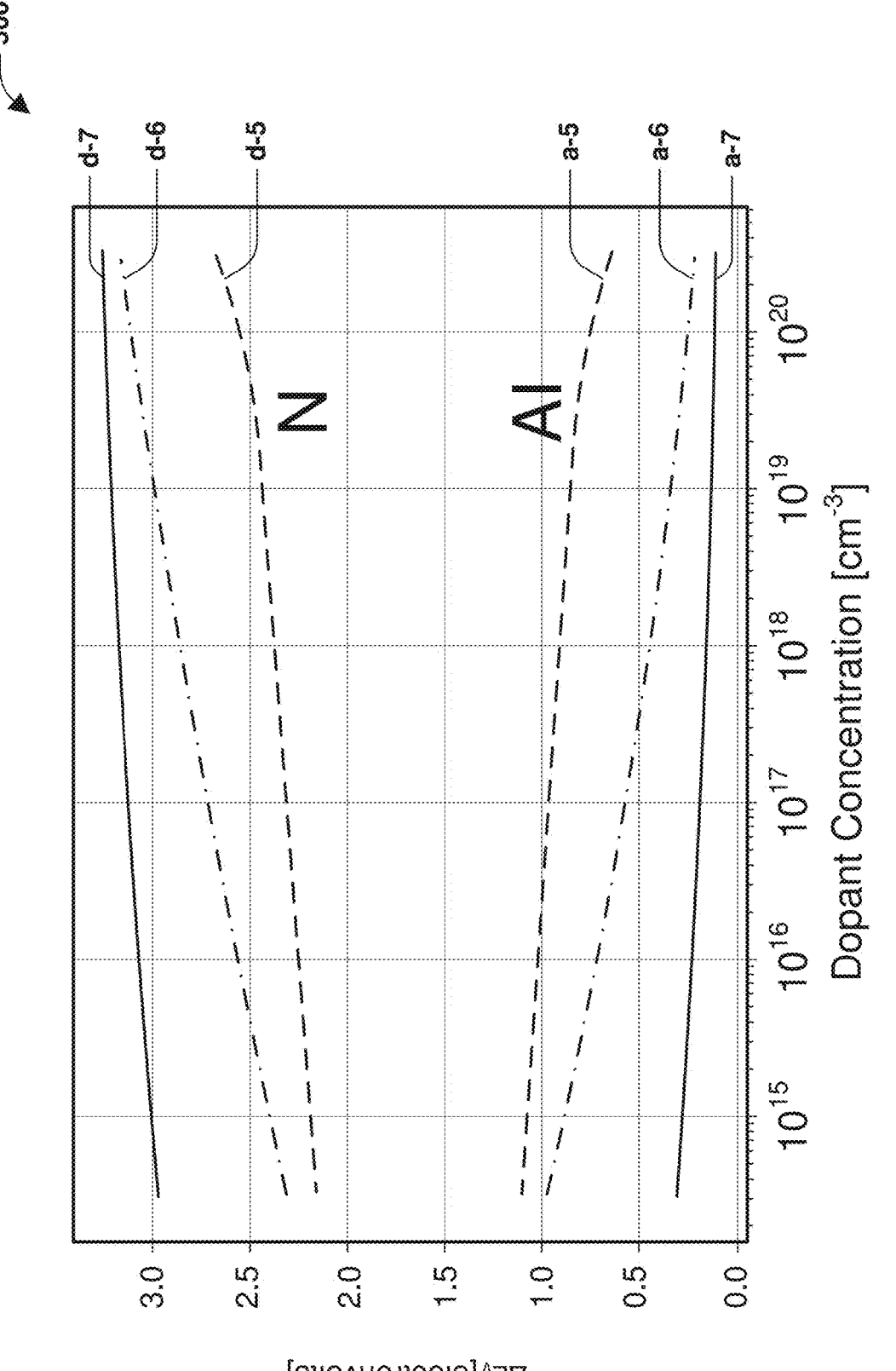
FIG. 5A is a data set representative of example energy difference curves associated with various parameters.

FIG. 5A illustrates a data set 500 representative of example energy difference curves associated with various parameters. In some examples, curves d-5, d-6 and d-7 are associated with donors (e.g., n-type dopants) and/or n-doped regions. Curves a-5, a-6 and a-7 are associated with acceptors (e.g., p-type dopants) and/or p-doped regions.

In some examples, curves d-5 and a-5 correspond to a first scenario in which (i) the sample has a temperature within a first range (e.g., from at least 23° Celsius to at most 30° Celsius) during the SEM process and/or (ii) energy differences indicated by curves d-5 and a-5 are determined with quasi Fermi level splitting (e.g., the quasi Fermi level splitting parameter $\Delta E_f$ may be in the range of at least 1 electronvolt to at most 2 electronvolts). In some examples, in the first scenario, curves d-5 and/or a-5 may be used for determining dopant concentrations of the plurality of regions of the sample. In some examples, curves d-5 and/or a-5 may be based upon (and/or may correspond to) a first reference energy difference profile associated with the first scenario. The first reference energy difference profile (and/or curves d-5 and/or a-5) may be determined based upon one or more characteristics (e.g., one or more materials, one or more properties, etc.) of the sample, the one or more SEM parameters, the first bias, a temperature of the sample during the SEM process, and/or other information.

In some examples, curves d-6 and a-6 correspond to a second scenario in which (i) the sample has a temperature within a second range (e.g., from at least 450° Celsius to at most 600° Celsius) during the SEM process and/or (ii) energy differences indicated by curves d-6 and a-6 are determined without quasi Fermi level splitting (e.g., the quasi Fermi level splitting parameter $\Delta E_f$ may be set to zero). In some examples, in the second scenario, curves d-6 and/or a-6 may be used for determining dopant concentrations of the plurality of regions of the sample. In some examples, curves d-6 and/or a-6 may be based upon (and/or may correspond to) a second reference energy difference profile associated with the second scenario.

In some examples, curves d-7 and a-7 correspond to a third scenario in which (i) the sample has a temperature within the first range during the SEM process and/or (ii) energy differences indicated by curves d-7 and a-7 are determined without quasi Fermi level splitting (e.g., the quasi Fermi level splitting parameter $\Delta E_f$ may be set to zero). In some examples, in the third scenario, curves d-7 and/or a-7 may be used for determining dopant concentrations of the plurality of regions of the sample. In some examples, curves d-7 and/or a-7 may be based upon (and/or may correspond to) a third reference energy difference profile associated with the third scenario.

Figure 5B:
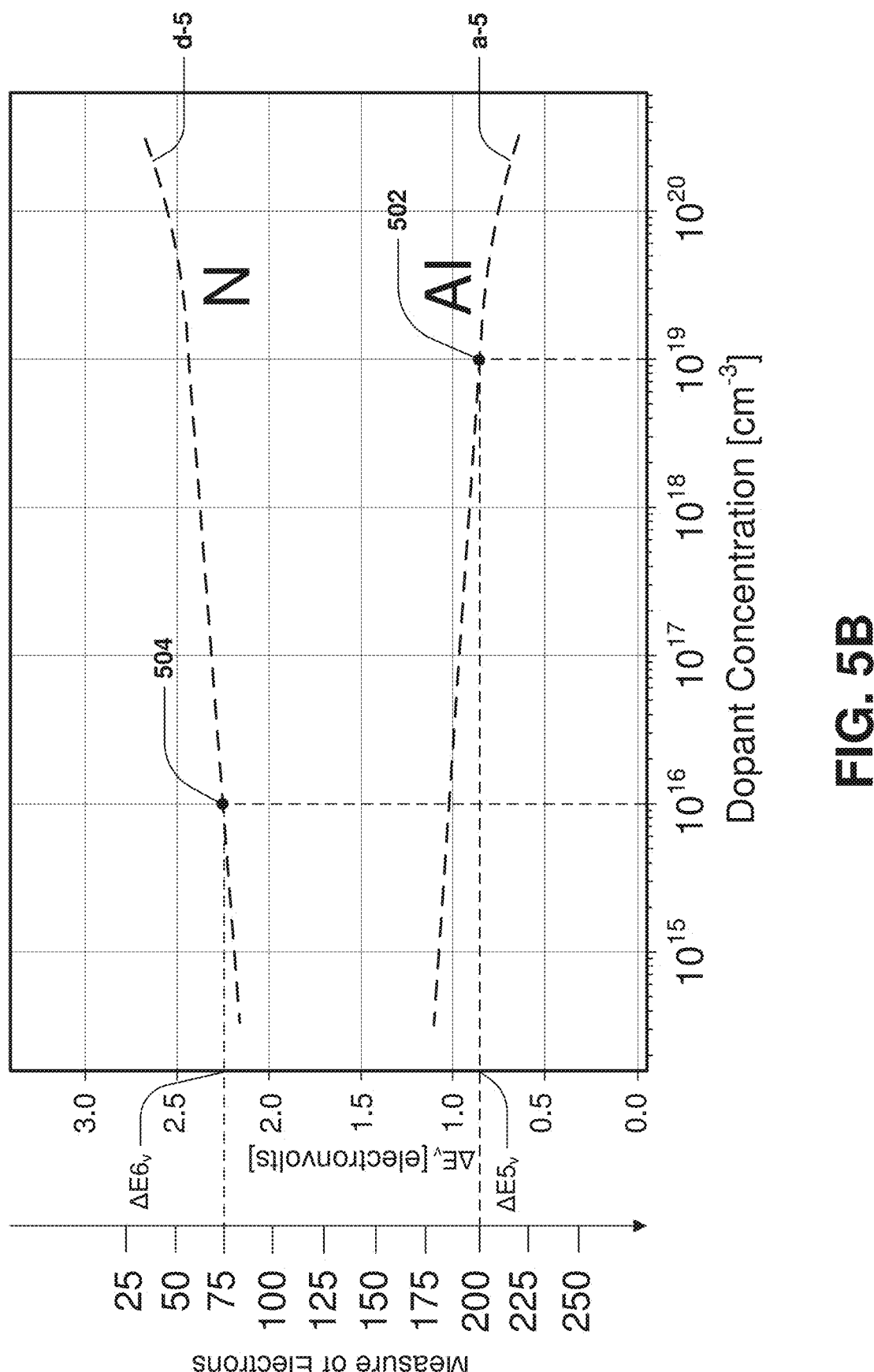
FIG. 5B is a data set representative of one or more measures of electrons mapped to points of example energy difference curves.

FIG. 5B illustrates mapping one or more measures of electrons to one or more points of curves d-5 and a-5 associated with the first scenario. The first measure of electrons (indicated by the SEM map) associated with the first region may be mapped to a point 502, of curve a-5, corresponding to (i) the fifth energy difference $\Delta E5_v$ (determined for the first region) and (ii) the first reference dopant concentration (e.g., p-type dopant concentration, which may be $10^{\wedge}19$ cm$^{-3}$ in FIG. 5B, for example) associated with the first region (e.g., p-doped region). In the example shown in FIG. 5B, the first measure of electrons corresponds to 200, which may be the pixel value of the first pixel (in the SEM map) corresponding to the first region. In some examples, one or more conversion functions for converting a measure of electrons (indicated by the SEM map) to an energy difference $\Delta E_v$ (e.g., difference between a Fermi level and a valence band energy level) may be determined. For example, a third conversion function (e.g., a linear function and/or other type of function) for converting a measure of electrons associated with a p-doped region to an energy difference $\Delta E_v$ may be determined based upon the first measure of electrons (e.g., 200 in FIG. 5B) and the fifth energy difference $\Delta E5_v$.

The second measure of electrons (indicated by the SEM map) associated with the second region may be mapped to a point 504, of curve d-5, corresponding to (i) the sixth energy difference $\Delta E6_v$ (determined for the second region) and (ii) the second reference dopant concentration (e.g., n-type dopant concentration, which may be $10^{\wedge}16$ cm$^{-3}$ in FIG. 5B, for example) associated with the second region (e.g., n-doped region). In the example shown in FIG. 5B, the second measure of electrons corresponds to 75, which may be the pixel value of the second pixel (in the SEM map) corresponding to the second region. Alternatively and/or additionally, a fourth conversion function (e.g., a linear function and/or other type of function) for converting a measure of electrons associated with an n-doped region to an energy difference $\Delta E_v$ may be determined based upon the second measure of electrons (e.g., 75 in FIG. 5B) and the sixth energy difference $\Delta E6_v$.

In some examples, one or more conversion functions for converting an energy difference $\Delta E_v$ (e.g., difference between a Fermi level and a valence band energy level) to a dopant concentration may be determined based upon curves a-5 and/or d-5. For example, a fifth conversion function for converting an energy difference $\Delta E_v$ (associated with a p-doped region, for example) to a dopant concentration (e.g., a p-type dopant concentration) may be determined based upon curve a-5. In an example, the fifth conversion function may be determined by inverting curve a-5 (e.g., curve a-5 may correspond to a function of dopant concentration relative to energy difference $\Delta E_v$, and the fifth conversion function may correspond to an inverse function of curve a-5). Alternatively and/or additionally, a sixth conversion function for converting an energy difference $\Delta E_v$ (associated with an n-doped region, for example) to a dopant concentration (e.g., an n-type dopant concentration) may be determined based upon curve d-5. In an example, the sixth conversion function may be determined by inverting curve d-5 (e.g., curve d-5 may correspond to a function of dopant concentration relative to energy difference $\Delta E_v$, and the sixth conversion function may correspond to an inverse function of curve d-5).

Thus, in accordance with some embodiments, a measure of electrons (indicated by the SEM map) associated with a p-doped region may be converted to a dopant concentration (e.g., p-type dopant concentration) in the p-doped region by (i) converting the measure of electrons to a corresponding energy difference $\Delta E_v$ using the third conversion function, and/or (ii) converting the corresponding energy difference $\Delta E_v$ to the dopant concentration (e.g., p-type dopant concentration) using the fifth conversion function. Alternatively and/or additionally, a measure of electrons (indicated by the SEM map) associated with an n-doped region may be converted to a dopant concentration (e.g., n-type dopant concentration) in the n-doped region by (i) converting the measure of electrons to a corresponding energy difference $\Delta E_v$ using the fourth conversion function, and/or (ii) converting the corresponding energy difference $\Delta E_v$ to the dopant concentration (e.g., n-type dopant concentration) using the sixth conversion function.

In some examples, the third function, the fourth function, the fifth function and/or the fifth function may be combined to determine a combined conversion function (e.g., a simplified function). FIG. 5C illustrates a data set 550 representative of example conversion function curves associated with the combined conversion function. A horizontal axis of the data set 550 may correspond to a measure of electrons (indicated by the SEM map, for example). Positive values of a vertical axis of the data set 550 may correspond to $\log_{10} N_p$, where $N_p$ corresponds to p-type dopant concentration. Negative values of the vertical axis of the data set 550 may correspond to $-\log_{10} N_n$, where $N_n$ corresponds to n-type dopant concentration. Dashed lines in FIG. 5C indicate the first reference dopant concentration (e.g., $10^{\wedge}19$ cm$^{-3}$) associated with the first region, the first measure of electrons (e.g., 200) associated with the first region, the second reference dopant concentration (e.g., $10^{\wedge}16$ cm$^{-3}$) associated with the second region and/or the second measure of electrons (e.g., 200) associated with the first region.

In some examples, curve c-1 corresponds to an example of the combined conversion function in the first scenario (associated with curves d-5 and a-5, for example). In some examples, curve c-2 corresponds to an example of the combined conversion function in the second scenario (associated with curves d-6 and a-6, for example). In some examples, using the combined function, measures of electrons of the SEM map may be converted to dopant concentrations in the plurality of regions. In some examples, the dopant concentrations may be used to generate a dopant distribution map of the sample.

FIG. 6 is an illustration of an example method 600 for determining sample information of a sample. At 602, a SEM process may be performed on a sample to generate a SEM map. The SEM map may be indicative of a first measure of electrons relative to a first region of the sample and a second measure of electrons relative to a second region of the sample. The first region may be associated with a reference dopant concentration (e.g., the reference dopant concentration corresponding to the first region may be predefined and/or known). At 604, a conversion function may be determined based upon the reference dopant concentration and the first measure of electrons associated with the first region. In some examples, the conversion function is determined based upon an energy difference corresponding to a difference between a Fermi level associated with the sample and a valence band energy level associated with the sample. The energy difference may be determined based upon the first measure of electrons. At 606, the conversion function may be used to convert the second measure of electrons to a second dopant concentration in the second region. In some examples, the second measure of electrons may be used (in conjunction with other dopant concentrations determined using the conversion function, for example) to generate a dopant distribution map.

In accordance with some embodiments, a dopant distribution map associated with a sample may be generated based upon one or more SEM maps. In some examples, the dopant distribution map may be indicative of a plurality of dopant concentrations associated with a plurality of regions of the sample. In some examples, a dopant concentration (indicated by the dopant distribution map, for example) may be indicative of a quantity of dopants per unit of area (e.g., $cm^{-2}$) and/or a quantity of dopants per unit of volume (e.g., $cm^{-3}$).

FIG. 7A illustrates an example of the dopant distribution map (shown with reference number 700 in FIG. 7A). The dopant distribution map 700 may be generated based upon a SEM map 750 shown in FIG. 7B. In some examples, the sample may comprise SiC (e.g., the sample may comprise a SiC substrate), such as 4H—SiC. Alternatively and/or additionally, the sample may comprise aluminum dopants and/or nitrogen dopants. In some examples, dopant concentrations of the dopant distribution map 700 may be determined using quasi Fermi level splitting (e.g., a quasi Fermi level splitting parameter used to calculate the dopant concentrations may be in the range of at least 1 electronvolt to at most 2 electronvolts).

A pixel of the dopant distribution map 700 may be indicative of a dopant concentration of a region of the sample. In some examples, n-type dopant concentrations (e.g., nitrogen dopant concentrations) are indicated using a first color (e.g., blue) and/or p-type dopant concentrations (e.g., aluminum dopant concentrations) are indicated using a second color. For example, a pixel of an n-doped region may be blue and/or a pixel of a p-doped region may be red. In some examples, a color intensity of a pixel of the dopant distribution map 700 is based upon a dopant concentration associated with a region corresponding to the pixel. For example, a pixel having a darker shade of red may indicate a greater n-type dopant concentration than a pixel having a lighter shade of red. In some examples, positive values of a color bar of the dopant distribution map 700 may correspond to $\log_{10} N_p$, where $N_p$ corresponds to p-type dopant concentration. Negative values of the color bar of the dopant distribution map 700 may correspond to $-\log_{10} N_n$, where $N_n$ corresponds to n-type dopant concentration.

In some examples, a pixel of a region associated with a dopant concentration determined to not meet a threshold dopant concentration may be set to a predefined color (e.g., white). In some examples, a dopant concentration may be determined not to meet the threshold dopant concentration based upon a determination that a magnitude of the dopant concentration is smaller than the threshold dopant concentration. In some examples, the threshold dopant concentration is in the range of at least $1\times10^{\wedge}14$ $cm^{-3}$ to at most $5\times10^{\wedge}15$ $cm^{-3}$ (such as $1\times10^{\wedge}15$ $cm^{-3}$, for example). For example, plotting dopant concentrations that do not meet the threshold dopant concentration with the predefined color (e.g., white) may provide for improved visibility of a distribution of dopant concentrations and/or features of the sample. In some examples, a space charge region 702 (shown in FIG. 7A) associated with a p-n junction of the sample may be identified (e.g., automatically identified) based upon the dopant distribution map 700. Alternatively and/or additionally, one or more metrics associated with the space charge region 702, such as a length 704 of the space charge region 702, may be determined (e.g., automatically determined) based upon the dopant distribution map 700.

FIG. 8 illustrates a data set 800 representative of line profiles associated with SEM maps. A vertical axis of the data set 800 may correspond to a secondary electron signal (e.g., a measure of secondary electrons detected using a scanning electron microscope) and/or a horizontal axis of the data set 800 may correspond to depth. The data set 800 is based upon SEM maps (e.g., SEM images) of a sample. The sample may comprise an epitaxially grown staircase structure. The data set 800 provides a first line profile I-1 of a first SEM map of the sample, a second line profile I-2 of a second SEM map of the sample and/or a third line profile I-3 of a third SEM map of the sample. In some examples, the first SEM map, the second SEM map and the third SEM map are generated at different temperatures (e.g., the first SEM map may be determined via a first SEM process performed when the sample has a first temperature, the second SEM map may be determined via a second SEM process performed when the sample has a second temperature greater than the first temperature, and/or the third SEM map may be determined via a third SEM process performed when the sample has a third temperature greater than the second temperature). In some examples, line profiles I-1, I-2 and/or I-3 are min-max scaled line profiles. In some examples, due to thermal radiation causing a signal on an electron detector used to generate the SEM maps, brightness and/or contrast values associated with the scanning electron microscope may be adjusted to avoid over-saturating and/or under-saturating the SEM maps. The data set 800 shown in FIG. 8 may exhibit a temperature dependence of the SEM maps. For example, temperature differences between the SEM maps may be associated with differences of the secondary electron signal. Alternatively and/or additionally, the temperature dependence may be associated with dopant concentration. In an example, compared with higher doped regions, lower doped regions may become more intrinsic at higher temperatures. Using one or more of the techniques provided herein, the temperature dependence may be exploited to determine dopant concentrations based upon the SEM maps.

In some examples, a measure of electric field strength of a sample may be determined using one or more of the techniques provided herein with respect to determining a dopant concentration. In some examples, a defect concentration (e.g., a quantity of defects per unit of area and/or unit of volume) of a sample may be determined using one or more of the techniques provided herein with respect to determining a dopant concentration.

In some examples, one or more of the techniques provided herein may be implemented for semiconductor device design purposes. A dopant distribution map of a sample (e.g., at least a portion of a semiconductor wafer) may be generated using one or more of the techniques provided herein. A structure may be designed based upon the dopant distribution map of the sample. One or more semiconductor fabrication acts may be performed on the sample to produce a semiconductor device corresponding to the designed structure.

In some examples, a dopant distribution map of the sample may be determined as part of a sample testing process (e.g., a wafer testing process). In the sample testing process, the dopant distribution map may be compared with an expected dopant distribution map to determine whether the sample is correctly doped. In some examples, in response to determining that the sample is correctly doped (e.g., the dopant distribution map matches the expected dopant distribution map), the sample (and/or a batch of wafers comprising the sample) may be approved for subsequent semiconductor processing. In some examples, in response to determining that the sample is incorrectly doped (e.g., the dopant distribution map does not match the expected dopant distribution map), one or more corrective actions may be performed. In some examples, the one or more corrective actions comprise (i) repairing the sample (e.g., performing one or more subsequent dopant implantations to adjust dopant distribution), (ii) sending an alert indicative of a potential wafer processing error, (iii) scrapping the sample (and/or scrapping one or more wafers comprising the sample), and/or (iv) one or more other actions. In some embodiments, repairing the sample (e.g., the wafer) prior to a subsequent fabrication process protects the sample from damage that would occur if the sample underwent the subsequent fabrication process without being repaired.

It may be appreciated that some embodiments of the present disclosure may be implemented without a scanning electron microscope and/or using processes other than SEM. In some example, particles other than electrons may be used to determine metrics associated with a sample at different temperatures and/or with different sample biases. The determined metrics may be used to determine sample information comprising at least one of one or more dopant concentrations of the sample, one or more electric field strengths of the sample, one or more Fermi levels of the sample, etc.

According to some embodiments, a method is provided. The method comprises performing, when a sample has a first temperature, a first SEM process on the sample to generate a first SEM map; performing, when the sample has a second temperature different than the first temperature, a second SEM process on the sample to generate a second SEM map; and generating, based upon the first SEM map and the second SEM map, a dopant distribution map indicative of a first dopant concentration in a first region of the sample and a second dopant concentration in a second region of the sample.

According to some embodiments, the sample comprises a filled electron valence band.

According to some embodiments, performing the first SEM process comprises emitting a first electron beam to the sample when the sample has the first temperature; detecting first electrons emitted from the sample via interactions of electrons of the first electron beam with the sample; determining a first measure of electrons based upon the first electrons; and generating the first SEM map based upon the first measure of electrons. Performing the second SEM process comprises emitting a second electron beam to the sample when the sample has the second temperature; detecting second electrons emitted from the sample via interactions of electrons of the second electron beam with the sample; determining a second measure of electrons based upon the second electrons; and generating the second SEM map based upon the second measure of electrons.

According to some embodiments, the first measure of electrons comprises a first measure of secondary electrons emitted from the sample; and the second measure of electrons comprises a second measure of secondary electrons emitted from the sample.

According to some embodiments, performing the first SEM process comprises performing the first SEM process using a first scanning electron microscope; and performing the second SEM process comprises performing the second SEM process using the first scanning electron microscope.

According to some embodiments, the first SEM map is indicative of a first measure of electrons relative to the first region of the sample; the second SEM map is indicative of a second measure of electrons relative to the first region of the sample. Generating the dopant distribution map comprises determining, based upon the first measure of electrons, a first difference between a first Fermi level associated with the sample and a first valence band energy level associated with the sample; determining, based upon the second measure of electrons, a second difference between a second Fermi level associated with the sample and a second valence band energy level associated with the sample; and determining the first dopant concentration in the first region based upon the first difference and the second difference.

According to some embodiments, the method comprises heating the sample prior to and/or during the first SEM process.

According to some embodiments, the sample is supported by a sample stage of a scanning electron microscope used to perform the first SEM process; and heating the sample comprises directing thermal energy, to the sample, via the sample stage.

According to some embodiments, a difference between the first temperature and the second temperature is at least 10° Celsius.

According to some embodiments, the method comprises applying a first bias to the sample during the first SEM process; and applying a second bias to the sample during the second SEM process.

According to some embodiments, a method is provided. The method comprises determining a first measure of electrons of a sample when the sample has a first temperature; determining a second measure of electrons of the sample when the sample has a second temperature different than the first temperature; and determining, based upon the first measure of electrons and the second measure of electrons, sample information, associated with the sample, comprising a dopant concentration of the sample, a measure of electric field strength of the sample, a defect concentration of the sample, a Fermi level of the sample, and/or an indication of a space charge region of the sample.

According to some embodiments, the sample comprises a filled electron valence band.

According to some embodiments, the method comprises emitting a first electron beam to the sample when the sample has the first temperature; detecting first electrons emitted from the sample via interactions of electrons of the first electron beam with the sample, wherein determining the first measure of electrons is based upon the first electrons; emitting a second electron beam to the sample when the sample has the second temperature; and detecting second electrons emitted from the sample via interactions of electrons of the second electron beam with the sample, wherein determining the second measure of electrons is based upon the second electrons.

According to some embodiments, the first measure of electrons comprises a first measure of secondary electrons emitted from the sample; and the second measure of electrons comprises a second measure of secondary electrons emitted from the sample.

According to some embodiments, determining the sample information associated with the sample comprises determining, based upon the first measure of electrons, a first difference between a first Fermi level associated with the sample and a first valence band energy level associated with the sample; determining, based upon the second measure of electrons, a second difference between a second Fermi level associated with the sample and a second valence band energy level associated with the sample; and determining the sample information based upon the first difference and the second difference.

According to some embodiments, the sample information comprises a map indicative of a dopant distribution associated with the sample, an electric field strength distribution associated with the sample, a Fermi level energy distribution associated with the sample, and/or the space charge region associated with the sample.

According to some embodiments, a method is provided. The method comprises performing a SEM process on a sample to generate a SEM map indicative of a first measure of electrons relative to a first region of the sample and a second measure of electrons relative to a second region of the sample, wherein the first region is associated with a reference dopant concentration; determining, based upon the reference dopant concentration and the first measure of electrons associated with the first region, a conversion function; and converting, using the conversion function, the second measure of electrons to a second dopant concentration in the second region of the sample.

According to some embodiments, the method comprises determining, based upon the first measure of electrons, a difference between a Fermi level associated with the sample and a valence band energy level associated with the sample, wherein determining the conversion function is based upon the difference.

According to some embodiments, performing the SEM process comprises emitting an electron beam to the sample; detecting first electrons emitted from the sample via interactions of electrons of the first electron beam with the sample; and determining the first measure of electrons based upon the first electrons.

According to some embodiments, the first measure of electrons comprises a first measure of secondary electrons emitted from the sample; and the second measure of electrons comprises a second measure of secondary electrons emitted from the sample.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering may be implemented without departing from the scope of the disclosure. Further, it will be understood that not all operations are necessarily present in each embodiment provided herein. Also, it will be understood that not all operations are necessary in some embodiments.

Any aspect or design described herein as an "example" and/or the like is not necessarily to be construed as advantageous over other aspects or designs. Rather, use of the word "example" and/or the like is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method comprising:
   performing, when a sample has a first temperature, a first scanning electron microscopy (SEM) process on the sample to generate a first SEM map;
   performing, when the sample has a second temperature different than the first temperature, a second SEM process on the sample to generate a second SEM map; and
   generating, based upon the first SEM map and the second SEM map, a dopant distribution map indicative of a first dopant concentration in a first region of the sample and a second dopant concentration in a second region of the sample.

2. The method of claim 1, wherein:

the sample comprises a filled electron valence band.

3. The method of claim 1, wherein:

performing the first SEM process comprises:

emitting a first electron beam to the sample when the sample has the first temperature;

detecting first electrons emitted from the sample via interactions of electrons of the first electron beam with the sample;

determining a first measure of electrons based upon the first electrons; and generating the first SEM map based upon the first measure of electrons; and performing the second SEM process comprises:

emitting a second electron beam to the sample when the sample has the second temperature;

detecting second electrons emitted from the sample via interactions of electrons of the second electron beam with the sample;

determining a second measure of electrons based upon the second electrons; and generating the second SEM map based upon the second measure of electrons.

4. The method of claim 3, wherein:

the first measure of electrons comprises a first measure of secondary electrons emitted from the sample; and the second measure of electrons comprises a second measure of secondary electrons emitted from the sample.

5. The method of claim 1, wherein:

performing the first SEM process comprises performing the first SEM process using a first scanning electron microscope; and performing the second SEM process comprises performing the second SEM process using the first scanning electron microscope.

6. The method of claim 1, wherein:

the first SEM map is indicative of a first measure of electrons relative to the first region of the sample;

the second SEM map is indicative of a second measure of electrons relative to the first region of the sample; and generating the dopant distribution map comprises:

determining, based upon the first measure of electrons, a first difference between a first Fermi level associated with the sample and a first valence band energy level associated with the sample;

determining, based upon the second measure of electrons, a second difference between a second Fermi level associated with the sample and a second valence band energy level associated with the sample; and determining the first dopant concentration in the first region based upon the first difference and the second difference.

7. The method of claim 1, comprising:

at least one of prior to or during the first SEM process, heating the sample.

8. The method of claim 7, wherein:

the sample is supported by a sample stage of a scanning electron microscope used to perform the first SEM process; and heating the sample comprises directing thermal energy, to the sample, via the sample stage.

9. The method of claim 1, wherein:

a difference between the first temperature and the second temperature is at least 10° Celsius.

10. The method of claim 1, comprising:

applying a first bias to the sample during the first SEM process; and applying a second bias to the sample during the second SEM process.

* * * * *